(12) United States Patent
Kadoguchi et al.

(10) Patent No.: US 8,884,411 B2
(45) Date of Patent: Nov. 11, 2014

(54) SEMICONDUCTOR DEVICE AND MANUFACTURING METHOD THEREOF

(75) Inventors: Takuya Kadoguchi, Toyota (JP); Shingo Iwasaki, Toyota (JP); Takanori Kawashima, Anjo (JP); Tomomi Okumura, Toyota (JP); Masayoshi Nishihata, Chiryu (JP)

(73) Assignees: Toyota Jidosha Kabushiki Kaisha, Toyota-Shi (JP); Denso Corporation, Kariya (JP)

( * ) Notice: Subject to any disclaimer, the term of this patent is extended or adjusted under 35 U.S.C. 154(b) by 0 days.

(21) Appl. No.: 14/112,408

(22) PCT Filed: Apr. 18, 2012

(86) PCT No.: PCT/IB2012/000773
§ 371 (c)(1),
(2), (4) Date: Oct. 17, 2013

(87) PCT Pub. No.: WO2012/143784
PCT Pub. Date: Oct. 26, 2012

(65) Prior Publication Data
US 2014/0035112 A1 Feb. 6, 2014

(30) Foreign Application Priority Data

Apr. 19, 2011 (JP) ................................ 2011-093334
Dec. 22, 2011 (JP) ................................ 2011-281695

(51) Int. Cl.
H01L 23/02 (2006.01)
H01L 23/00 (2006.01)
H01L 23/495 (2006.01)

(52) U.S. Cl.
CPC ................ *H01L 24/30* (2013.01); *H01L 24/34* (2013.01); *H01L 2924/01082* (2013.01);

(Continued)

(58) Field of Classification Search
USPC ................... 257/625, 666, 707, 678; 438/123
See application file for complete search history.

(56) References Cited

U.S. PATENT DOCUMENTS 6,072,240 A    6/2000 Kimura et al.
6,917,103 B2*  7/2005 Hirano et al. ................. 257/707

(Continued)

FOREIGN PATENT DOCUMENTS

EP    1148547 A2   10/2001
EP    2028692 A1    2/2009

(Continued)

*Primary Examiner* — Roy Potter
(74) *Attorney, Agent, or Firm* — Kenyon & Kenyon LLP

(57) ABSTRACT

A semiconductor device includes a first semiconductor element; a first thick plate portion that is electrically connected to an electrode on a lower surface side of the first semiconductor element, and is formed by a conductor; a second semiconductor element that is arranged such that a main surface of the second semiconductor element faces a main surface of the first semiconductor element; a second thick plate portion that is electrically connected to an electrode on a lower surface side of the second semiconductor element, and is formed by a conductor; a third thick plate portion that is electrically connected to an electrode on an upper surface side of the first semiconductor element, and is formed by a conductor; a fourth thick plate portion that is electrically connected to an electrode on an upper surface side of the second semiconductor element, and is formed by a conductor; a first thin plate portion that is provided on the second thick plate portion, is formed by a conductor, and is thinner than the second thick plate portion; and a second thin plate portion that is provided on the third thick plate portion, is formed by a conductor, and is thinner than the third thick plate portion. The first thin plate portion and the second thin plate portion are fixed together and electrically connected.

21 Claims, 13 Drawing Sheets

(52) U.S. Cl.
CPC .......... *H01L 2224/45124* (2013.01); *H01L 2224/32245* (2013.01); H01L 24/73 (2013.01);*H01L 2924/01047* (2013.01); *H01L 2924/13055* (2013.01); *H01L 2224/48091* (2013.01); *H01L 2924/01079* (2013.01); *H01L 2224/45144* (2013.01); *H01L 2924/01013* (2013.01); *H01L 2224/83* (2013.01); *H01L 2924/01033* (2013.01); H01L 23/49575 (2013.01); *H01L 2924/014* (2013.01); *H01L 2224/73221* (2013.01); *H01L 24/48* (2013.01); *H01L 2924/01005* (2013.01); *H01L 2924/01023* (2013.01); H01L 23/49562 (2013.01); *H01L 2924/01029* (2013.01); H01L 24/83 (2013.01); *H01L 2924/01006* (2013.01); *H01L 2224/73265* (2013.01); H01L 23/49548 (2013.01); *H01L 2924/01074* (2013.01)
USPC .......................... 257/666; 257/625; 438/123

(56) References Cited

U.S. PATENT DOCUMENTS

| | | | | |
|---|---|---|---|---|
| 7,772,709 | B2 * | 8/2010 | Ueda et al. | 257/787 |
| RE43,663 | E * | 9/2012 | Kawashima et al. | 257/678 |
| 2001/0033477 | A1 | 10/2001 | Inoue et al. | |
| 2004/0183188 | A1 | 9/2004 | Oohama | |
| 2005/0167802 | A1 | 8/2005 | Hirano et al. | |
| 2006/0108700 | A1 | 5/2006 | Nakasawa et al. | |
| 2007/0176266 | A1 | 8/2007 | Kawano et al. | |

FOREIGN PATENT DOCUMENTS

| | | | |
|---|---|---|---|
| JP | 2001-308263 | A | 11/2001 |
| JP | 2002-270736 | A | 9/2002 |
| JP | 2006-134990 | A | 5/2006 |
| JP | 2007-173703 | A | 7/2007 |
| JP | 4192396 | B2 | 12/2008 |
| JP | 2009-164647 | A | 7/2009 |

* cited by examiner

F I G . 11
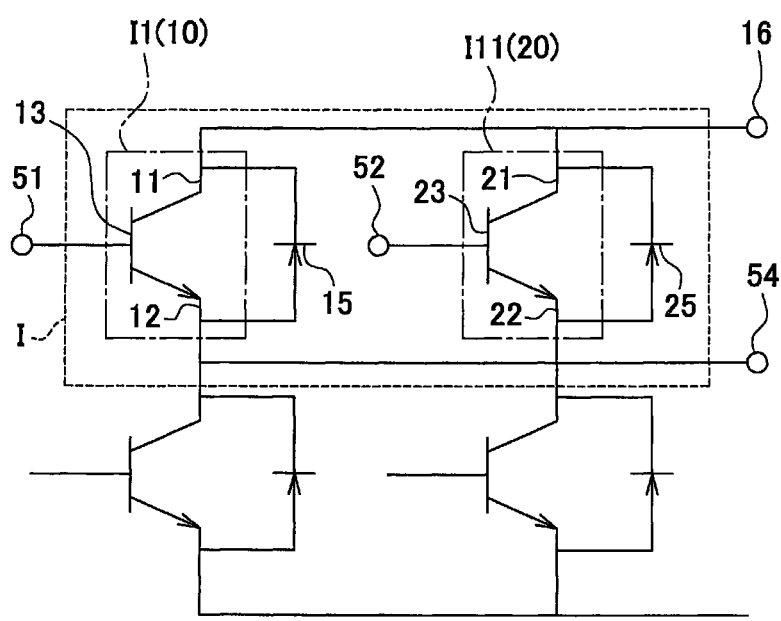

SEMICONDUCTOR DEVICE AND MANUFACTURING METHOD THEREOF

CROSS REFERENCE TO RELATED APPLICATION

This is a national phase application based on the PCT International Patent Application No. PCT/IB2012/00773 filed on Apr. 18, 2012, claiming priority to Japanese application Nos. 2011-093334 filed Apr. 19, 2011 and 2011-281695 filed Dec. 22, 2011, the entire contents of all of which are incorporated herein by reference.

BACKGROUND OF THE INVENTION

1. Field of the Invention

The invention relates to a semiconductor device and a manufacturing method thereof.

2. Description of Related Art

The demand for a power semiconductor device having a power semiconductor element, and a power semiconductor module provided with a power semiconductor device, is increasing due to an increase in demand for power equipment having a function of a power control circuit power or a power converter circuit such as an inverter or a converter.

Insulated Gate Bipolar Transistors (IGBTs) are used as power semiconductor elements. An IGBT is a semiconductor element in which a base of a bipolar transistor has been replaced with a gate of a field-effect transistor (referred to as a "FET"). An IGBT has the high speed and the power durability of a current-drive system bipolar transistor, and the thrifty power consumption of a voltage-drive system bipolar transistor.

Japanese Patent Application Publication No. 2001-308263 (JP 2001-308263 A) describes an example in which two such IGBTs are connected in series between a high-order power supply and a low-order power supply. The two IGBTs corresponding to the high side and the low side are provided lined up from left to right. The high side IGBT is provided flipped vertically, and the low side IGBT is provided not flipped vertically. A main electrode surface on the high-order power supply side of the high side IGBT is connected to a high side plate that is a metal plate on the high side. The main electrode surface on the low-order power supply side of the high side IGBT and the main electrode surface on the high-order power supply side of the low side IGBT are connected to a middle side plate that is a metal plate midway between the high side and the low side. The main electrode surface on the low-order power supply side of the low side IGBT is connected to a low side plate that is a metal plate on the low side.

However, the semiconductor device described above has the following problems.

One of the high side IGBT and the low side IGBT is flipped vertically, and the other is not flipped vertically. As a result, when arranging the IGBTs, a process of vertically flipping one of the IGBTs must be added.

Also, when a collector electrode is formed on an electrode surface on the high-order power supply side of the IGBT, and an emitter electrode is formed on an electrode surface on the low-order power supply side of the IGBT, a spacer for heat release or height adjustment may be provided on the emitter electrode side. Also, the spacer and the emitter electrode of the high side IGBT, as well as the spacer and the middle side plate, are electrically and thermally connected by solder joints, for example. Also, the spacer and the emitter electrode of the low side IGBT, as well as the spacer and the low side plate, are electrically and thermally connected by solder joints, for example.

As described above, when one IGBT is flipped vertically, the heights of the joint locations of the IGBTs are different on the high side than they are on the low side. When inspecting the state of the joint at a joint location, such as when performing a void inspection of a solder joint location, for example, the inspection must be performed setting the focal point for each joint location height. Therefore, the inspection takes more time to perform.

Also, the foregoing problems are also common among semiconductor devices in which two IGBTs are arranged in parallel. Moreover, the foregoing problems are not limited to IGBTs, but are also common among semiconductor devices in which two of any of a variety of types of semiconductor elements including three-terminal elements or two-terminal elements are connected in series or in parallel.

SUMMARY OF THE INVENTION

The invention thus provides a semiconductor device, and a manufacturing method thereof, that does not require a semiconductor element to be flipped vertically when the semiconductor is arranged, so the inspection time can be shortened.

A first aspect of the invention relates to a semiconductor device. This semiconductor device includes a first semiconductor element; a first thick plate portion that is electrically connected to an electrode on a lower surface side of the first semiconductor element, and that is formed by a conductor; a second semiconductor element arranged such that a main surface of the second semiconductor element faces a main surface of the first semiconductor element; a second thick plate portion that is electrically connected to an electrode on a lower surface side of the second semiconductor element, and that is formed by a conductor; a third thick plate portion that is electrically connected to an electrode on an upper surface side of the first semiconductor element, and that is formed by a conductor; a fourth thick plate portion that is electrically connected to an electrode on an upper surface side of the second semiconductor element, and that is formed by a conductor; a first thin plate portion that is provided on the second thick plate portion, is formed by a conductor, and is thinner than the second thick plate portion; and a second thin plate portion that is provided on the third thick plate portion, is formed by a conductor, and is thinner than the third thick plate portion. The first thin plate portion and the second thin plate portion are fixed together and electrically connected.

In this semiconductor device, the first thin plate portion may be provided on the first thick plate portion side of the second thick plate portion, the second thin plate portion may be provided on the fourth thick plate portion side of the third thick plate portion, and the first thin plate portion and the second thin plate portion may be electrically connected in a position between a position of the first thick plate portion and a position of the third thick plate portion, in a thickness direction of the first semiconductor element.

In this semiconductor device, the first thin plate portion and the second thin plate portion may be electrically connected in a position midway between the position of the first thick plate portion and the position of the third thick plate portion, in the thickness direction of the first semiconductor element.

In the semiconductor device described above, the first thin plate portion may be provided on the first thick plate portion side of the second thick plate portion, the second thin plate portion may be provided on the fourth thick plate portion side of the third thick plate portion, the second thin plate portion may extend horizontally and have a same flat surface as a lower surface of the third thick plate portion, and the first thin plate portion may include a shaped portion that is bent upward to form a joining surface that contacts a lower surface of the second thin plate portion.

The semiconductor device described above may also include resin that covers the first semiconductor element, the second semiconductor element, the first thin plate portion, and the second thin plate portion.

This semiconductor device may also include an external lead that is electrically connected to one of the first, second, third, and fourth thick plate portions, and is exposed outside of the resin, and the first thin plate portion and the second thin plate portion may each have a thickness of equal to or greater than that of the external lead.

The semiconductor device described above may also include a third semiconductor element arranged at a predetermined interval from the first semiconductor element, on the first thick plate portion, and a side surface of the resin may have an indented portion that is indented inward on a side opposite the second thin plate portion, in an area that includes the predetermined interval.

The semiconductor device described above may also include a fourth semiconductor element arranged at the predetermined interval from the second semiconductor element, on the second thick plate portion, and a side surface of the resin may have an indented portion that is indented inward on a side opposite the first thin plate portion, in an area that includes the predetermined interval.

In the semiconductor device described above, a groove may be formed an area of at least one of a joining surface that is formed on the first thin plate portion and contacts a lower surface of the second thin plate portion, and a joining surface that is formed on the second thin plate portion and contacts an upper surface of the first thin plate portion.

A second aspect of the invention relates to a semiconductor device. This semiconductor device includes a first semiconductor element; a second semiconductor element that faces a same direction as the first semiconductor element, and in which a same-side surface that is a surface on a same side as one surface of the first semiconductor element is provided so as to be substantially flush with the one surface of the first semiconductor element; a first thick plate portion that is electrically connected to the one surface of the first semiconductor element, and that is formed by a conductor; a second thick plate portion that is electrically connected to the same-side surface of the second semiconductor element, and that is formed by a conductor; a third thick plate portion that is electrically connected to a surface on a side opposite the one surface of the first semiconductor element, and that is formed by a conductor; a fourth thick plate portion that is electrically connected to a surface on a side opposite the same-side surface of the second semiconductor element, and that is formed by a conductor; a first thin plate portion that is formed by a conductor that is thinner than the first thick plate portion and the second thick plate portion, and that is electrically connected to the first thick plate portion and the second thick plate portion; and a second thin plate portion that is formed by a conductor that is thinner than the third thick plate portion and the fourth thick plate portion, and that is electrically connected to the third thick plate portion and the fourth thick plate portion.

In this semiconductor device, the second semiconductor element may be a same kind of semiconductor element as the first semiconductor element, a first electrode may be formed on the one surface of the first semiconductor element and the same-side surface of the second semiconductor element, a second electrode may be formed on the surface on the side opposite the one side of the first semiconductor element and the surface on the side opposite the same-side surface of the second semiconductor element, the first thick plate portion may be electrically connected to the first electrode of the first semiconductor element, the second thick plate portion may be electrically connected to the first electrode of the second semiconductor element, the third thick plate portion may be electrically connected to the second electrode of the first semiconductor element, and the fourth thick plate portion may be electrically connected to the second electrode of the second semiconductor element.

In this semiconductor device, the first semiconductor element and the second semiconductor element may both be IGBTs, and the first electrode may be a collector electrode, and the second electrode may be an emitter electrode.

A third aspect of the invention relates to a semiconductor device manufacturing method. This semiconductor device manufacturing method includes a first step of arranging a first conductive plate that is formed by a conductor and includes a first thick plate portion, a second thick plate portion, and a first thin plate portion that is provided between the first thick plate portion and the second thick plate portion and is thinner than both the first thick plate portion and the second thick plate portion, such that the first thick plate portion contacts one surface of a first semiconductor element, and the second thick plate portion contacts a same-side surface, that is a surface on a same side as the one surface, of a second semiconductor element provided facing a same direction as the first semiconductor element; a second step of arranging a second conductive plate that is formed by a conductor and includes a third thick plate portion, a fourth thick plate portion, and a second thin plate portion that is provided between the third thick plate portion and the fourth thick plate portion and is thinner than both the third thick plate portion and the fourth thick plate portion, such that the third thick plate portion contacts a surface on a side opposite the one side of the first semiconductor element, and the fourth thick plate portion contacts a surface that is on a side opposite the same-side surface of a second semiconductor element; and a third step of electrically connecting the one surface of the first semiconductor element with the first thick plate portion, electrically connecting the surface on the side opposite the one surface of the first semiconductor element with the third thick plate portion, electrically connecting the same-side surface of the second semiconductor element with the second thick plate portion, and electrically connecting the surface on the side opposite the same-side surface of the second semiconductor element with the fourth thick plate portion.

The semiconductor device manufacturing method described above may also include a fourth step of separating the first thin plate portion from the first thick plate portion, and separating the second thin plate portion from the fourth thick plate portion, and contacting the separated first thin plate portion with the separated second thin plate portion; and a fifth step of electrically connecting the first thin plate portion and the second thin plate portion that are contacting each other.

In the semiconductor device manufacturing method described above, one surface of the first thick plate portion, one surface of the second thick plate portion, and one surface of the first thin plate portion may be flush; the first step may involve arranging the first conductive plate such that the one surface of the first thick plate portion contacts the first semiconductor element, and the one surface of the second thick plate portion contacts the second semiconductor element; one surface of the third thick plate portion, one surface of the fourth thick plate portion, and one surface of the second thin plate portion may be flush; and the second step may involve arranging the second conductive plate such that the one surface of the third thick plate portion contacts the first semiconductor element, and the one surface of the fourth thick plate portion contacts the second semiconductor element.

In the semiconductor device manufacturing method described above, the second semiconductor element may be a same kind of semiconductor element as the first semiconductor element; a first electrode may be formed on the one surface of the first semiconductor element and the same-side surface of the second semiconductor element; a second electrode may be formed on the surface on the side opposite the one side of the first semiconductor element and the surface on the side opposite the same-side surface of the second semiconductor element; and the third step may involve electrically connecting the first electrode of the first semiconductor element to the first thick plate portion, electrically connecting the second electrode of the first semiconductor element to the third thick plate portion, electrically connecting the first electrode of the second semiconductor element to the second thick plate portion, and electrically connecting the second electrode of the second semiconductor element to the fourth thick plate portion.

In this semiconductor device manufacturing method, the first semiconductor element and the second semiconductor element may both be IGBTs, the first electrode may be a collector electrode, and the second electrode may be an emitter electrode.

According to the semiconductor device and semiconductor device manufacturing method according to the various aspects of the invention, a process of vertically flipping a semiconductor element when the semiconductor element is arranged is not necessary, so the inspection time can be shortened.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 11 is a circuit diagram of the structure of the semiconductor device according to the second example embodiment of the invention;

DETAILED DESCRIPTION OF EMBODIMENTS

Next, example embodiments of the invention will be described with reference to the accompanying drawings.

First Example Embodiment

First, a semiconductor device and a manufacturing method thereof according to a first example embodiment of the invention will be described. The semiconductor device according to this example embodiment has an Insulated-Gate Bipolar Transistor (hereinafter referred to as "IGBT") as a semiconductor element.

First, the semiconductor device according to this example embodiment will be described.

Figure 1:
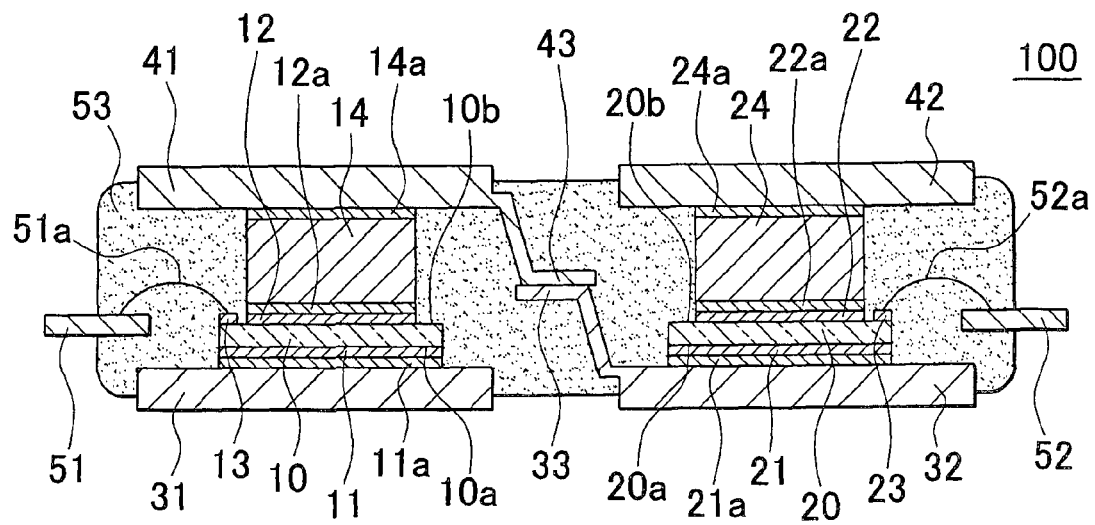
FIG. 1 is a sectional view showing a frame format of the structure of a semiconductor device according to a first example embodiment of the invention.

FIG. 1 is a sectional view showing a frame format of the structure of the semiconductor device according to this example embodiment.

The semiconductor device 100 includes a first semiconductor element 10, a second semiconductor element 20, a first thick plate portion 31, a second thick plate portion 32, a first thin plate portion 33, a third thick plate portion 41, a fourth thick plate portion 42, a second thin plate portion 43, a first control electrode terminal 51, a second control electrode terminal 52, and an encapsulation resin portion 53.

The first semiconductor element 10 and the second semiconductor element 20 are the same type of IGBT. In the description below, the first semiconductor element 10 and the second semiconductor element 20 may also be referred to as "IGBT 10" and the "IGBT 20", respectively.

The IGBT 10 has a collector electrode 11, an emitter electrode 12, and a gate electrode 13. The collector electrode 11 is formed on one surface 10a. The emitter electrode 12 and the gate electrode 13 are formed on a surface 10b on the side opposite the surface 10a.

The IGBT 20 has a collector electrode 21, an emitter electrode 22, and a gate electrode 23. The collector electrode 21 is formed on a surface 20a that is on the same side as the surface 10a. The emitter electrode 22 and the gate electrode 23 are formed on a surface 20b on the side opposite the surface 20a. That is, the IGBT 20 is provided facing the same direction as the IGBT 10.

The IGBT 20 is provided such that the surface 20a is substantially flush with the surface 10a of the IGBT 10.

The first thick plate portion 31 is formed by a conductor, and is electrically connected to the collector electrode 11 of the IGBT 10 via joining material 11a. The second thick plate portion 32 is formed by a conductor, and is electrically connected to the collector electrode 21 of the IGBT 20 via joining material 21a. The first thick plate portion 31 and the second thick plate portion 32 may be the same thickness.

The first thin plate portion 33 is provided on the first thick plate portion 31 side of the second thick plate portion 32, is formed by a conductor, and is thinner than both the first thick plate portion 31 and the second thick plate portion 32. As will be described later with reference to FIG. 4, the thickness T1 of the first thick plate portion 31 and the second thick plate portion 32 may be 2 to 3 mm, for example, and the thickness T2 of the first thin plate portion 33 may be 0.5 mm, for example.

Also, as will be described later in the manufacturing method of the semiconductor device according to this example embodiment, a first lead frame 30 is broken apart between the first thick plate portion 31 and the second thick plate portion 32 that is provided with the first thin plate portion 33. Therefore, the first thick plate portion 31, the second thick plate portion 32, and the first thin plate portion 33 may be formed by the same type of conductor, and the second thick plate portion 32 and the first thin plate portion 33 may be integrally formed. The conductor may be formed by a metal plate of copper (Cu), nickel (Ni), or aluminum (Al) or the like, or by a metal plate of Cu, Ni, or Al or the like that is plated with silver (Ag) or gold (Au) or the like, for example.

Also, tin-type solder, for example, may be used as the joining material 11a and 21a.

The third thick plate portion 41 is formed by a conductor and is electrically connected to the emitter electrode 12 of the IGBT 10 via a spacer 14. That is, the third thick plate portion 41 is electrically connected to the spacer 14 via joining material 14a, and the spacer 14 is electrically connected to the emitter electrode 12 of the IGBT 10 via joining material 12a.

The fourth thick plate portion 42 is formed by a conductor and is electrically connected to the emitter electrode 22 of the IGBT 20 via a spacer 24. That is, the fourth thick plate portion 42 is electrically connected to the spacer 24 via joining material 24a, and the spacer 24 is electrically connected to the emitter electrode 22 of the IGBT 20 via joining material 22a.

The second thin plate portion 43 is provided on the fourth thick plate portion 42 side of the third thick plate portion 41, is formed by a conductor, and is thinner than both the third thick plate portion 41 and the fourth thick plate portion 42. As will be described later with reference to FIG. 4, the thickness T1 of the third thick plate portion 41 and the fourth thick plate portion 42 may be 2 to 3 mm, for example, and the thickness T2 of the second thin plate portion 43 may be 0.5 mm, for example.

Also, as will be described later in the manufacturing method of the semiconductor device according to this example embodiment, a second lead frame 40 is broken apart between the third thick plate portion 41 and the fourth thick plate portion 42 that is provided with the second thin plate portion 43. Therefore, the third thick plate portion 41, the fourth thick plate portion 42, and the second thin plate portion 43 may be formed by the same type of conductor, and the third thick plate portion 41 and the second thin plate portion 43 may be integrally formed. The conductor may be formed by a metal plate of Cu, Ni, or Al or the like, or by a metal plate of Cu, Ni, or Al or the like that is plated with silver (Ag) or gold (Au) or the like, for example.

Also, tin-type solder, for example, may be used as the joining material 12a, 14a, 22a, and 24a.

The first thin plate portion 33 is bent from the second thick plate portion 32 side toward the fourth thick plate portion 42 side in the thickness direction of the IGBTs 10 and 20. The second thin plate portion 43 is bent from the third thick plate portion 41 side toward the first thick plate portion 31 side in the thickness direction of the IGBTs 10 and 20. Also, the first thin plate portion 33 and the second thin plate portion 43 are electrically connected at a position midway between the position of the first thick plate portion 31 and the position of the third thick plate portion 41, in the thickness direction of the IGBTs 10 and 20. That is, the first thin plate portion 33 and the second thin plate portion 43 are electrically connected at a position midway between the position of the second thick plate portion 32 and the position of the fourth thick plate portion 42, in the thickness direction of the IGBTs 10 and 20. Also, the first thin plate portion 33 and the second thin plate portion 43 are electrically connected at a position midway between the position of the second thick plate portion 32 and the position of the third thick plate portion 41, in the thickness direction of the IGBTs 10 and 20.

The first control electrode terminal 51 is electrically connected to the gate electrode 13 of the IGBT 10 via a bonding wire 51a formed by an Al wire or an Au wire or the like, for example. The second control electrode terminal 52 is electrically connected to the gate electrode 23 of the IGBT 20 via a bonding wire 52a formed by an Al wire or an Au wire or the like, for example.

The encapsulation resin portion 53 is provided to partially or entirely seal the IGBTs 10 and 20, the thick plate portions 31, 32, 41, and 42, the thin plate portions 33 and 43, and the control electrode terminals 51 and 52. As shown in FIG. 1, for example, the IGBTs 10 and 20 are entirely sealed.

Also, in FIG. 1, the encapsulation resin portion 53 covers the portion below the first thin plate portion 33 and the portion above the second thin plate portion 43, so the first thin plate portion 33 and the second thin plate portion 43 are not exposed on the surface. Therefore, the distance between the first thick plate portion 31 and the second thick plate portion 32, and the distance between the third thick plate portion 41 and the fourth thick plate portion 42, is taken up by the encapsulation resin portion 53 that is an insulating body, so the creepage distance between the first thick plate portion 31 and the second thick plate portion 32, and between the third thick plate portion 41 and the fourth thick plate portion 42, can be ensured, thus enabling insulation to be improved.

In this way, in the semiconductor device 100 according to this example embodiment, insulation between the first thick plate portion 31 and the second thick plate portion 32, and insulation between the third thick plate portion 41 and the fourth thick plate portion 42, can be ensured, so they can be arranged close together, thus enabling the overall semiconductor device 100 to be small.

Figure 2:
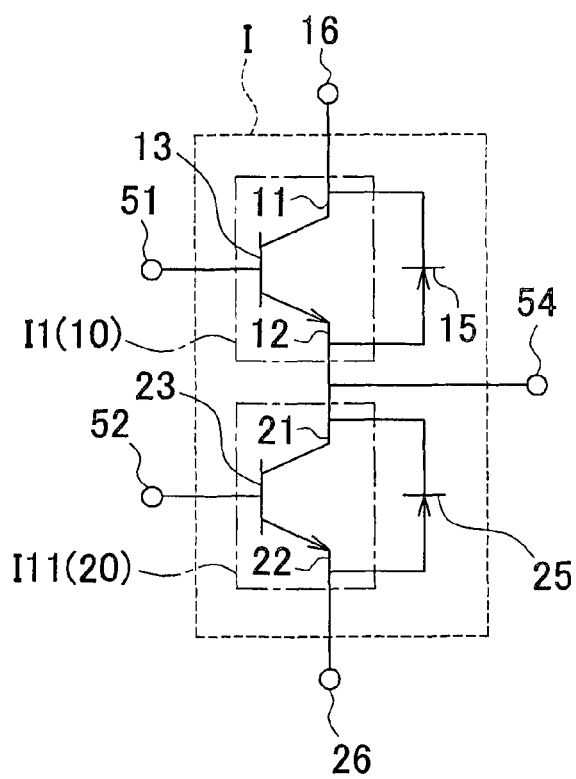
FIG. 2 is a circuit diagram of the structure of the semiconductor device according to the first example embodiment of the invention.

FIG. 2 is a circuit diagram of the structure of the semiconductor device according to this example embodiment. In FIG. 2, region I that is enclosed by the dotted line includes the semiconductor device shown in FIG. 1, and regions II and III enclosed by the alternate long and short dash lines may be regarded as the IGBTs 10 and 20, respectively.

The electrical circuit shown in FIG. 2 is such that an inverter circuit is provided between a high-order side power supply and a low-order side power supply. In this electrical circuit, the electrical circuit shown in region I enclosed by the dotted line includes diodes 15 and 25, in addition to the IGBTs 10 and 20. The diodes 15 and 25 are connected in inverse-parallel to the IGBTs 10 and 20, respectively. That is, the electrical circuit shown in region I enclosed by the dotted line may be regarded as a semiconductor module that is an inverter circuit that includes the semiconductor device according to this example embodiment.

A high-order side power supply connecting terminal 16 for connecting to the high-order side power supply is electrically connected to the collector electrode 11 of the IGBT 10. The high-order side power supply connecting terminal 16 is electrically connected to the first thick plate portion 31 of the semiconductor device 100.

A low-order side power supply connecting terminal 26 for connecting to the low-order side power supply is electrically connected to the emitter electrode 22 of the IGBT 20. The low-order side power supply connecting terminal 26 is electrically connected to the fourth thick plate portion 42 of the semiconductor device 100.

The first control electrode terminal 51 is electrically connected to the gate electrode 13 of the IGBT 10, and the second control electrode terminal 52 is electrically connected to the gate electrode 23 of the IGBT 20.

An output terminal 54 is electrically connected between the emitter electrode 12 of the IGBT 10 and the collector electrode 21 of the IGBT 20. The output terminal 54 is electrically connected to the second thick plate portion 32 and the third thick plate portion 41 of the semiconductor device 100.

Figure 3:
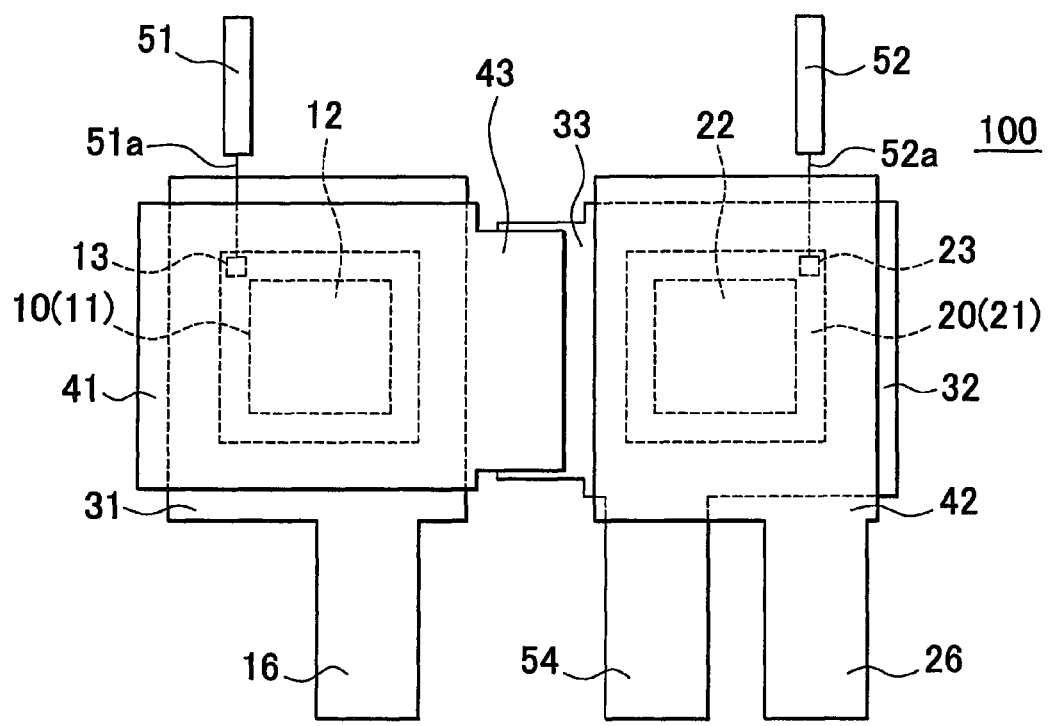
FIG. 3 is a plan view showing a frame format of the structure of the semiconductor device according to the first example embodiment of the invention.

FIG. 3 is a plan view showing a frame format of the structure of the semiconductor device according to this example embodiment. FIG. 3 is a view of the semiconductor device described with reference to FIG. 1, from above in FIG. 1, i.e., as viewed from above from the thick plate portion 41 and 42 side.

The IGBT 10 and the IGBT 20 are provided lined up facing the same direction. The second thin plate portion 43 is electrically connected to the emitter electrode 12 side of the IGBT 10 via the third thick plate portion 41. The first thin plate portion 33 is electrically connected to the collector electrode 21 side of the IGBT 20 via the second thick plate portion 32. The first thin plate portion 33 and the second thin plate portion 43 are arranged overlapping when viewed from above, and are electrically connected together.

The first control electrode terminal 51 and the second control electrode terminal 52 are provided on one side of the semiconductor device 100, when viewed from above. The first control electrode terminal 51 is electrically connected to the gate electrode 13 of the IGBT 10, and the second control electrode terminal 52 is electrically connected to the gate electrode 23 of the IGBT 20.

The high-order side power supply connecting terminal 16, the low-order side power supply connecting terminal 26, and the output terminal 54 are provided on the side of the semiconductor device 100 that is opposite the side on which the first control electrode terminal 51 and the second control electrode terminal 52 are provided. The high-order side power supply connecting terminal 16 is electrically connected to the first thick plate portion 31, the low-order side power supply connecting terminal 26 is electrically connected to the fourth thick plate portion 42, and the output terminal 54 is electrically connected to the third thick plate portion 41 and the second thick plate portion 32.

The semiconductor device 100 described with reference to FIG. 3, with the addition of the diodes 15 and 25 described with reference to FIG. 2, may be regarded as a semiconductor module 110 that will be described later with reference to FIG. 8.

Next, a manufacturing method of the semiconductor device according to this example embodiment will be described.

Figure 4:
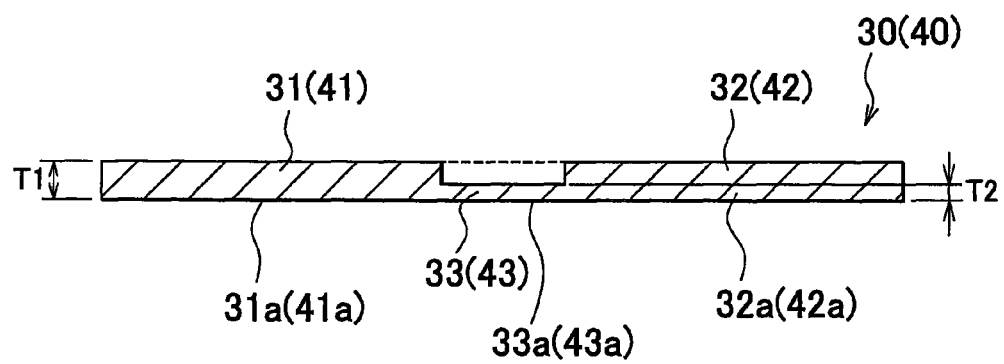
FIG. 4 is a sectional view showing a frame format of the structure of a lead frame used in a manufacturing method of the semiconductor device according to the first example embodiment of the invention.

FIG. 4 is a sectional view showing a frame format of the structure of a lead frame used in the manufacturing method of the semiconductor device according to this example embodiment. FIG. 4 shows an example is shown in which the first lead frame 30 and the second lead frame 40 have the same shape.

FIGS. 5A to 5C and 6A to 6C are sectional views showing frame formats of the manufacturing method of the semiconductor device according to this example embodiment. In FIGS. 5 and 6, portions that are the same as those in FIG. 1 will be denoted by like reference characters, and descriptions of those portions may be omitted.

Figure 5A:
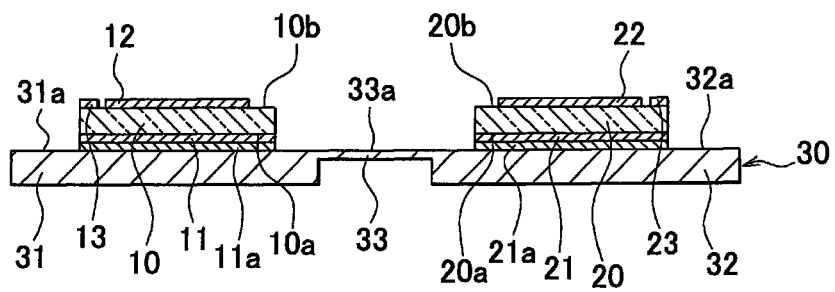
FIG. 5 is a sectional view (part 1) showing a frame format of the manufacturing method of the semiconductor device according to the first example embodiment of the invention.

First, in the process shown in FIG. 5A, the IGBT (i.e., the first semiconductor element) 10, the IGBT (i.e., the second semiconductor element) 20, and the first lead frame 30 are arranged.

In the process shown in FIG. 5A, first the first lead frame 30 is arranged.

As shown in FIG. 4, the first lead frame 30 includes the first thick plate portion 31, the second thick plate portion 32, and the first thin plate portion 33. The first thin plate portion 33 is provided between the first thick plate portion 31 and the second thick plate portion 32. The first thick plate portion 31, the second thick plate portion 32, and the first thin plate portion 33 are integrally formed. As described above, the first thin plate portion 33 is thinner than both the first thick plate portion 31 and the second thick plate portion 32. For example, the thickness T1 of the first thick plate portion 31 and the second thick plate portion 32 may be 2 to 3 mm, for example, and the thickness T2 of the first thin plate portion 33 may be 0.5 mm, for example.

Also, the first lead frame 30 may be formed by, for example, rolling a conductor formed by a metal plate of Cu, Ni, or Al or the like, or by a metal plate of Cu, Ni, or Al or the like that is plated with Ag or Au or the like, for example.

The first lead frame 30 may be regarded as a first conductive plate of the invention.

First, one surface 31a of the first thick plate portion 31, one surface 32a of the second thick plate portion 32, and one surface 33a of the first thin plate portion 33 may be flush, i.e., may form the same surface. As a result, the first thin plate portion 33 and the first thick plate portion 31 are able to be easily broken apart by applying pressure from the side opposite the one surface 33a of the first thin plate portion 33 in the process shown in FIG. 6A that will be described later.

Then, the IGBT 10 is arranged such that the one surface 31a of the first thick plate portion 31 contacts the collector electrode 11 of the IGBT 10 via the joining material 11a. Also, the IGBT 20 is arranged such that the one surface 32a of the second thick plate portion 32 contacts the collector electrode 21 of the IGBT 20 via the joining material 21a. That is, the IGBT 20 is arranged facing the same direction as the IGBT 10.

When the joining material 11a and 21a is tin-type solder, for example, solder joining by heat treatment may be performed in the process shown in FIG. 5A. Also, when the joining material 11a and 21a is metal foil of copper or aluminum, for example, ultrasonic joining may be performed in the process shown in FIG. 5A. Also, the joining may be performed together with joining by other joining material after the process shown in FIG. 6A.

Figure 5B:
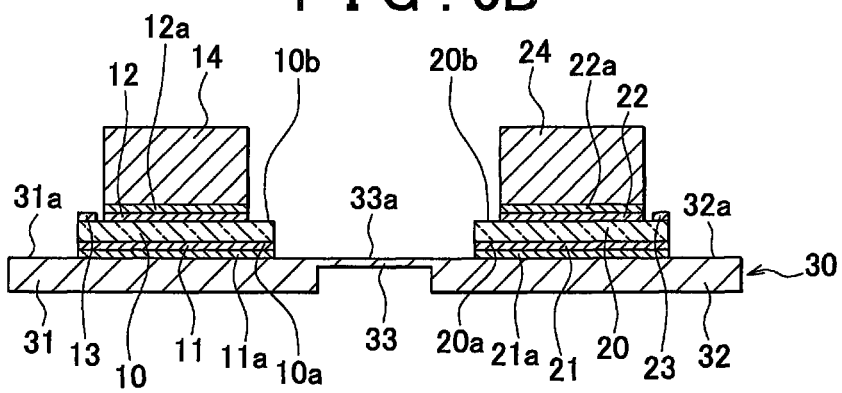

Next, in the process shown in FIG. 5B, the spacer 14 is arranged such that one surface of the spacer 14 contacts the emitter electrode 12 of the IGBT 10 via the joining material 12a. Also, the spacer 24 is arranged such that one surface of the spacer 24 contacts the emitter electrode 22 of the IGBT 20 via the joining material 22a.

When the joining material 12a and 22a is tin-type solder, for example, solder joining by heat treatment may be performed in the process shown in FIG. 5B. Also, when the joining material 12a and 22a is metal foil of copper or aluminum, for example, ultrasonic joining may be performed in the process shown in FIG. 5B. Also, the joining may be performed together with joining by other joining material after the process shown in FIG. 6A.

Figure 5C:
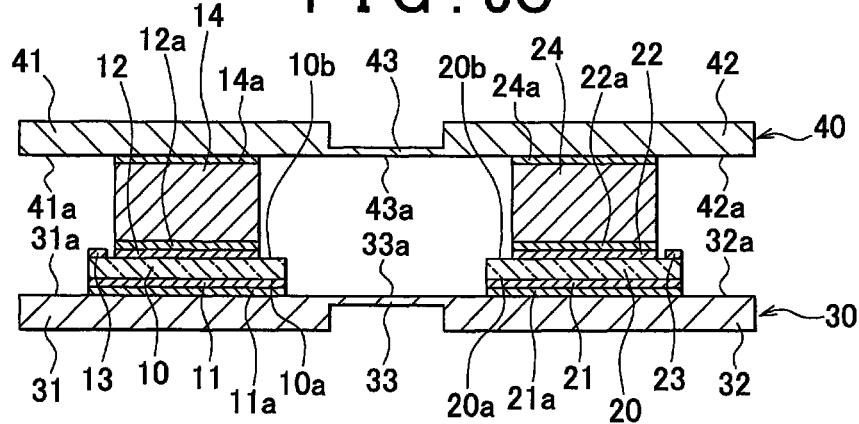

Next, in the process shown in FIG. 5C, the second lead frame 40 is arranged such that a surface 41a of the third thick plate portion 41 contacts the spacer 14 via the joining material 14a, and a surface 42a of the fourth thick plate portion 42 contacts the spacer 24 via the joining material 24a.

As shown in FIG. 4, the second lead frame 40 has the third thick plate portion 41, the fourth thick plate portion 42, and the second thin plate portion 43. The second thin plate portion 43 is provided between the third thick plate portion 41 and the fourth thick plate portion 42. The third thick plate portion 41, the fourth thick plate portion 42, and the second thin plate portion 43 are integrally formed. As described above, the second thin plate portion 43 is thinner than both the third thick plate portion 41 and the fourth thick plate portion 42. For example, the thickness T1 of the third thick plate portion 41 and the fourth thick plate portion 42 may be 2 to 3 mm, for example, and the thickness T2 of the second thin plate portion 43 may be 0.5 mm, for example.

Also, the second lead frame 40 may be formed by, for example, rolling a conductor formed by a metal plate of Cu, Ni, or Al or the like, or by a metal plate of Cu, Ni, or Al or the like that is plated with Ag or Au or the like, for example.

The second lead frame 40 may be regarded as a second conductive plate of the invention.

Also, the one surface 41a of the third thick plate portion 41, the one surface 42a of the fourth thick plate portion 42, and the one surface 43a of the second thin plate portion 43 may be flush, i.e., may form the same surface. Accordingly, the second thin plate portion 43 and the fourth thick plate portion 42 are able to be easily broken apart by applying pressure from the side opposite the one surface 43a of the second thin plate portion 43 in the process shown in FIG. 6A that will be described later.

When the joining material 14a and 24a is tin-type solder, for example, solder joining by heat treatment may be performed in the process shown in FIG. 5C. Also, when the joining material 14a and 24a is metal foil of copper or aluminum, for example, ultrasonic joining may be performed in the process shown in FIG. 5C. Also, the joining may be performed together with joining by other joining material after the process shown in FIG. 6A.

The arrangement of the members in FIGS. 5A to 5C may be performed by holding the members in a holding frame, not shown. At this time, the order of FIGS. 5A to 5C may be changed as appropriate. Thus, the second lead frame 40 may be arranged first, the spacers 14 and 24 may be arranged next, then the IGBTs 10 and 20 may be arranged, and the first lead frame 30 may be arranged last. Alternatively, the first lead frame 30, the IGBTs 10 and 20, the spacers 14 and 24, and the second lead frame 40 may all be arranged together by holding them all together in a holding frame, not shown.

Figure 6A:
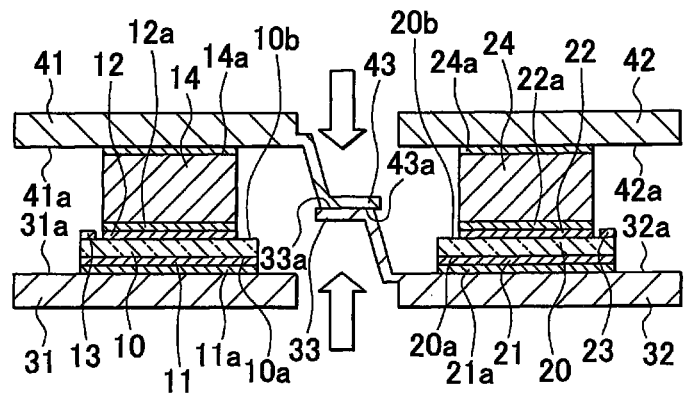
FIG. 6 is a sectional view (part 2) showing a frame format of the manufacturing method of the semiconductor device according to the first example embodiment of the invention.

Next, in the process shown in FIG. 6A, the first thin plate portion 33 is broken away from the first thick plate portion 31, the second thin plate portion 43 is broken away from the fourth thick plate portion 42, and the first thin plate portion 33 and second thin plate portion 43 that have both been broken away are made to contact one another.

With the structure shown in FIG. 5C held in place, pressure is applied by a press or the like, not shown, to pinch the first thin plate portion 33 and the second thin plate portion 43 together from above and below. At this time, pressure is applied to the first thin plate portion 33 from the side opposite the one surface 33a, and pressure is applied to the second thin plate portion 43 from the side opposite the surface 43a, such that the first thin plate portion 33 breaks away from the first thick plate portion 31 and the second thin plate portion 43 breaks away from the fourth thick plate portion 42. Also, the first thin plate portion 33 and the second thin plate portion 43 are made to contact each other by applying pressure to pinch the first thin plate portion 33 and the second thin plate portion 43 together from above and below.

In order to selectively break the first thin plate portion 33 away from the first thick plate portion 31 and selectively break the second thin plate portion 43 away from the fourth thick plate portion 42, a process for selectively breaking them may be performed by laser machining or the like in advance. Alternatively, the first thin plate portion 33 may be selectively broken away from the first thick plate portion 31 by applying pressure to an area near the boundary of the first thin plate portion 33 and the first thick plate portion 31, and the second thin plate portion 43 may be selectively broken away from the fourth thick plate portion 42, and applying pressure to an area near the boundary of the second thin plate portion 43 and the fourth thick plate portion 42.

Figure 6B:
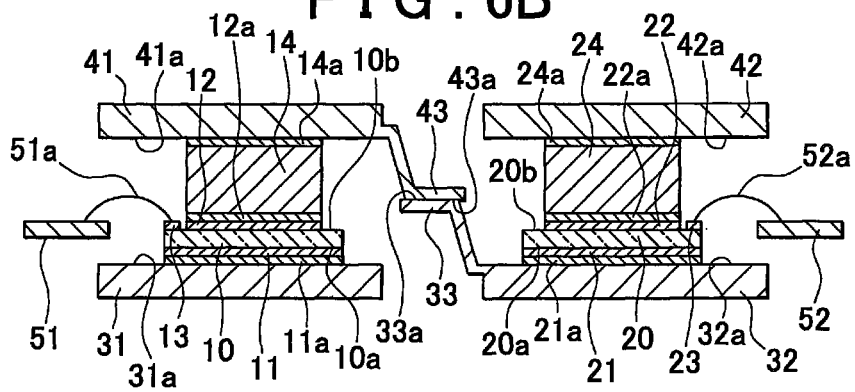

Next, in the process shown in FIG. 6B, the first thin plate portion 33 and the second thin plate portion 43 that are in contacting one another are joined.

When the first thin plate portion 33 and the second thin plate portion 43 are thin metal plates of Cu or Al or the like, for example, ultrasonic joining may be performed. Also, at this time, ultrasonic joining via the joining material 11a, 12a, 14a, 21a, 22a, and 24a may be performed all together, as described above.

Alternatively, the first thin plate portion 33 and the second thin plate portion 43 may be made to contact each other via joining material, not shown, of tin-type solder, for example, in the process shown in FIG. 6A, and then solder joining by heat treatment may be performed in the process shown in FIG. 6B. Also at this time, solder joining via the joining material 11a, 12a, 14a, 21a, 22a, and 24a may be performed all together as described above.

As a result of performing the processes up until the process shown in FIG. 6B, the collector electrode 11 of the IGBT 10 is electrically connected to the first thick plate portion 31, and the emitter electrode 12 of the IGBT 10 is electrically connected to the third thick plate portion 41 via the spacer 14.

Also, the first thin plate portion 33 and the second thin plate portion 43 are electrically connected together. Also, the collector electrode 21 of the IGBT 20 is electrically connected to the second thick plate portion 32, and the emitter electrode 22 of the IGBT 20 is electrically connected to the fourth thick plate portion 42 via the spacer 24.

Also, in the process shown in FIG. 6B, the first control electrode terminal 51 is arranged, and the gate electrode 13 of the IGBT 10 and the first control electrode terminal 51 are electrically connected via the bonding wire 51a that is formed by an Al wire or an Au wire or the like, for example. Also, the second control electrode terminal 52 is arranged, and the gate electrode 23 of the IGBT 20 and the second control electrode terminal 52 are electrically connected via the bonding wire 52a that is formed by an Al wire or an Au wire or the like, for example.

Figure 6C:
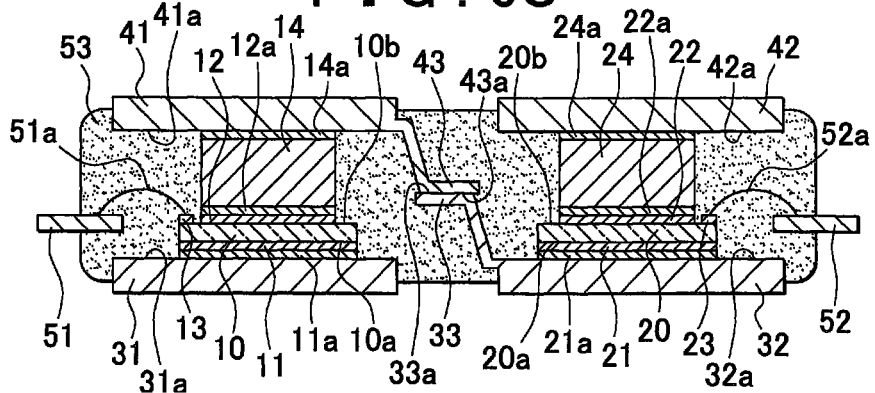

Next, in the process shown in FIG. 6C, the structure shown in FIG. 6B is sealed using epoxy resin, for example. At this time, the IGBTs 10 and 20 and the thin plate portions 33 and 43 are entirely sealed, and the thick plate portions 31, 32, 41, and 42, and the control electrode terminals 51 and 52 are partially sealed. Performing this process completes the semiconductor device 100.

Next, the obviation of the need for a process to vertically flip the semiconductor element when arranging the semiconductor element, and thus the ability to shorten the inspection time with the semiconductor device according to this example embodiment will be described in comparison to a comparative example.

Figure 7:
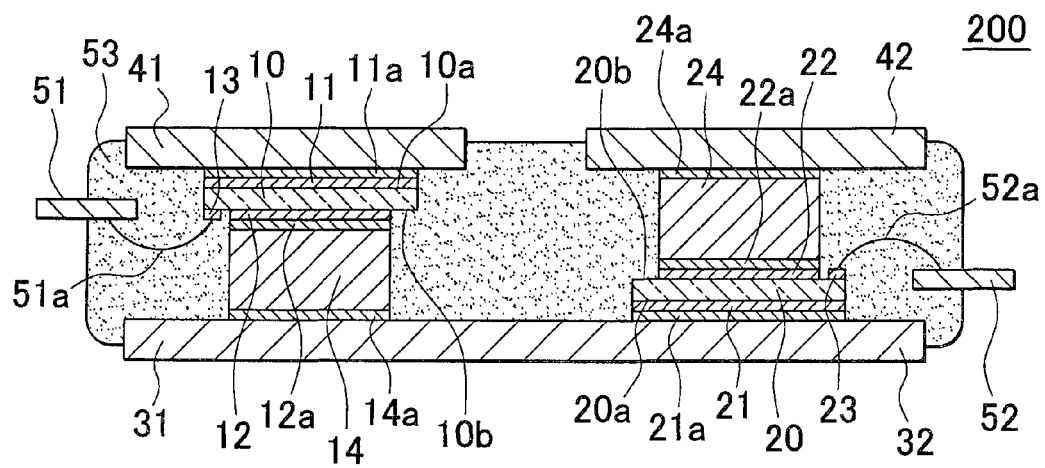
FIG. 7 is a sectional view showing a frame format of the structure of a semiconductor device according to a comparative example.

FIG. 7 is a sectional view showing a frame format of the structure of a semiconductor device according to a comparative example.

A semiconductor device 200 according to a comparative example includes IGBTs 10 and 20, a first thick plate portion 31, a second thick plate portion 32, a third thick plate portion 41, a fourth thick plate portion 42, a first control electrode terminal 51, a second control electrode terminal 52, and an encapsulation resin portion 53.

The IGBT 20, the fourth thick plate portion 42, the first control electrode terminal 51, the second control electrode terminal 52, and the encapsulation resin portion 53 have the same structures as the IGBT 20, the fourth thick plate portion 42, the first control electrode terminal 51, the second control electrode terminal 52, and the encapsulation resin portion 53, respectively, of the semiconductor device 100 according to the first example embodiment, so descriptions thereof will be omitted. Also, the second thick plate portion 32 has the same structure as the second thick plate portion 32 of the semiconductor device 100 according to the first example embodiment, except for that it is integrally formed with the first thick plate portion 31.

The IGBT 10 has the same structure as the IGBT 10 of the semiconductor device 100, except for that it is provided vertically flipped, including the vertical relationship with the spacer 14. The first thick plate portion 31 has the same structure as the first thick plate portion 31 of the semiconductor device 100 except for that it is integrally formed with the second thick plate portion 32, and is electrically connected to the emitter electrode 12 of the IGBT 10. The third thick plate portion 41 has the same structure as the third thick plate portion 41 of the semiconductor device 100, except for that it is not electrically connected to the second thick plate portion 32, and is electrically connected to the collector electrode 11 of the IGBT 10.

That is, the third thick plate portion 41 is electrically connected to the collector electrode 11 of the IGBT 10 via the joining material 11a. The first thick plate portion 31 is electrically connected to the emitter electrode 12 of the IGBT 10 via the joining material 14a, the spacer 14, and the joining material 12a.

In the manufacturing process of the semiconductor device 200 according to the comparative example, a process for vertically flipping the IGBT 10 when arranging the IGBT 10 is required.

Also, with the semiconductor device 200, at least the height of the joining material 12a and the height of the joining material 22a are not the same. Therefore, for example, when inspecting the joint state at a joint location, such as when performing a void inspection of a solder joint location, the inspection must be performed setting the focal point for each joining material height, so the inspection takes more time to perform.

On the other hand, with the semiconductor device 100 according to the example embodiment, the IGBT 10 faces the same direction as the IGBT 20, instead of being vertically flipped. Therefore, in the manufacturing process of the semiconductor device 100, the process of vertically flipping the IGBT 10 when arranging the IGBT 10 is not necessary.

Also, with the semiconductor device 100, the height of the joining material 12a and the height of the joining material 22a are the same. Also, height of the joining material 11a and the height of the joining material 21a are the same, and the height of the joining material 14a and the height of the joining material 24a are the same. That is, in the thickness direction of the IGBTs 10 and 20, the position of the joining material 11a and the position of the joining material 21a are the same position, the position of the joining material 12a and the position of the joining material 22a are the same position, and the position of the joining material 14a and the position of the joining material 24a are the same position. Therefore, in the manufacturing process of the semiconductor device 100, the number of height positions to set the focal point at when inspecting the joint state at the joint locations is fewer, so the inspection time is able to be shortened.

Figure 8:
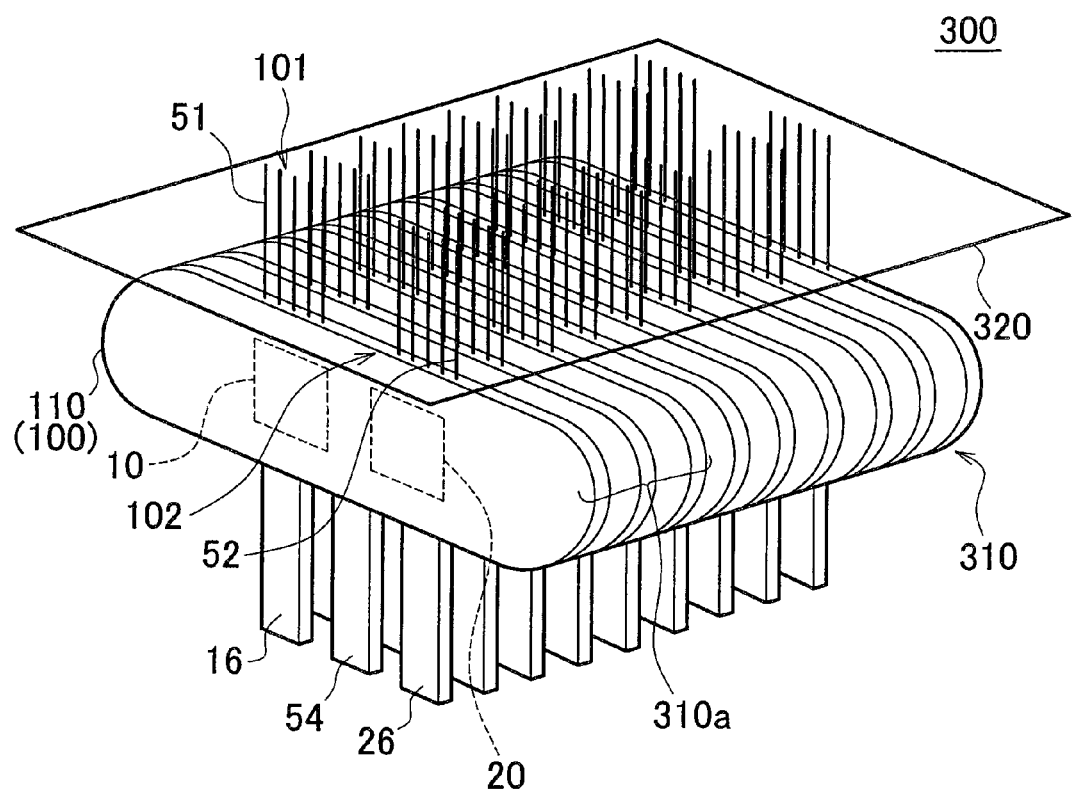
FIG. 8 is a perspective view of the structure of a power control unit provided with the semiconductor device according to the first example embodiment of the invention.

FIG. 8 is a perspective view of the structure of a power control unit provided with the semiconductor device according to the example embodiment.

As shown in FIG. 8, a power control unit 300 has a semiconductor module portion 310 and a control circuit board 320.

The semiconductor module portion 310 is formed by a plurality of semiconductor modules 110, each of which includes a semiconductor device 100 described with reference to FIG. 3 and diodes 15 and 25 described with reference to FIG. 2, stacked together. The direction in which the semiconductor modules 110 are stacked may be the direction from the collector electrode 11 side of the IGBT 10 toward the emitter electrode 12 side of the IGBT 10, for example. Also, this direction is the same direction as the direction from the collector electrode 21 side of the IGBT 20 toward the emitter electrode 22 side of the IGBT 20.

The control circuit board 320 is provided on the side of the semiconductor module portion 310 on which a first lead portion 101 that is formed by various control electrode terminals including the first control electrode terminal 51 of each of the semiconductor modules 110 is provided. The side on which this control circuit board 320 is provided is the same side as the side of the semiconductor modules 110 on which a second lead portion 102 that is formed by various control electrode terminals including the second control electrode terminal 52 is provided. The control electrode terminals of both the first lead portion 101 and the second lead portion 102 are connected to the control circuit board 320 through through-holes, not shown, formed in the control circuit board 320.

The high-order side power supply connecting terminal 16, the low-order side power supply connecting terminal 26, and the output terminal 54 of the semiconductor device 100 described with reference to FIG. 3 are provided on the side opposite the side on which the first lead portions 101 and the second lead portions 102 of the semiconductor modules 110 are provided.

A cooling mechanism, not shown, may be provided around the area where the IGBT 10 and the IGBT 20 of the semiconductor modules 110 are provided.

Three semiconductor modules 110 stacked together such that the output terminals 54 of the semiconductor modules 110 become a U-phase, a V-phase, and a W-phase, respectively, form a semiconductor module portion 310a. This kind of semiconductor module portion 310a formed by three semiconductor modules 110 may be used as an inverter circuit for converting electric power from direct-current power supplies that include the high-order side power supply and the low-order side power supply to three-phase alternating-current (AC) electric power, and driving a single AC motor, for example. Also, the power control unit 300 for driving a plurality of AC motors can be formed by stacking together a plurality of semiconductor module portions 310a and combining them with a control circuit board 320.

The power control unit 300 described above may be used not only for a vehicle, but also for railways, air-conditioners, elevators, refrigerators, and various other purposes. Also, the semiconductor modules 110 that form the power control unit 300 are not limited to semiconductor modules that form an inverter circuit. That is, the semiconductor modules 110 may also form a variety of other circuits, such as a DC/DC step-up converter, for example.

The power control unit 300 described above also includes the semiconductor device 100, so a process for vertically flipping the semiconductor element when arranging the semiconductor element is not necessary, so the inspection time can be shortened.

In this example embodiment, an example in which the same kind of IGBT is used for the first semiconductor element and the second semiconductor element is described. However, instead of an IGBT, any of a variety of three-terminal elements such as an FET (Field Effect Transistor) or a bipolar transistor may be used as the first semiconductor element and the second semiconductor element.

Also, with this example embodiment, the first semiconductor element and the second semiconductor element may be different kinds of semiconductor elements.

Modified Example of the First Example Embodiment

Next, a semiconductor device and a manufacturing method thereof according to a modified example of the first example embodiment of the invention will be described.

The semiconductor device according to this modified example differs from the semiconductor device according to the first example embodiment in that the semiconductor element is a two-terminal element.

Figure 9:
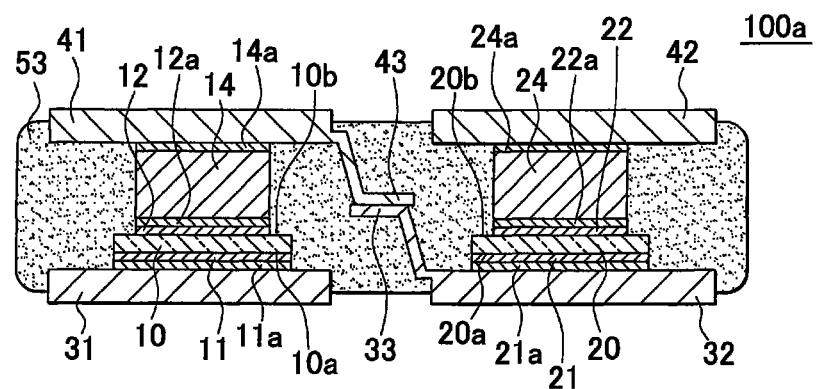
FIG. 9 is a sectional view showing a frame format of the structure of a semiconductor device according to a modified example of the first example embodiment of the invention.

FIG. 9 is a sectional view showing a frame format of the structure of the semiconductor device according to this modified example.

A semiconductor device 100a includes a first semiconductor element 10, a second semiconductor element 20, a first thick plate portion 31, a second thick plate portion 32, a first thin plate portion 33, a third thick plate portion 41, a fourth thick plate portion 42, a second thin plate portion 43, and an encapsulation resin portion 53. The first semiconductor element 10 and the second semiconductor element 20 of the semiconductor device 100a have the same structures as the IGBTs 10 and 20 of the semiconductor device 100, except for that neither has a gate electrode. Descriptions of like structures will be omitted.

The first semiconductor element 10 has an electrode 11 and an electrode 12. The collector electrode 11 is formed on one surface 10a, and the emitter electrode 12 is formed on a surface 10b that is on the side opposite the surface 10a. The second semiconductor element 20 has an electrode 21 and an electrode 22. The electrode 21 is formed on a surface 20a that is on the same side as the surface 10a. The electrode 22 is formed on a surface 20b that is on the side opposite the surface 20a. That is, the second semiconductor element 20 is provided facing the same direction as the first semiconductor element 10.

The first thick plate portion 31 is electrically connected to the collector electrode 11 of the first semiconductor element 10 via joining material 11a. The second thick plate portion 32 is electrically connected to the electrode 21 of the second semiconductor element 20 via joining material 21a. The third thick plate portion 41 is electrically connected to the electrode 12 of the first semiconductor element 10 via a spacer 14. The fourth thick plate portion 42 is electrically connected to the electrode 22 of the second semiconductor element 20 via a spacer 24.

With the semiconductor device 100a according to this modified example as well, the semiconductor elements 10 and 20 are both facing the same direction, instead of being vertically flipped. Therefore, in the manufacturing process of the semiconductor device 100a, a process of vertically flipping the first semiconductor element 10 when arranging the first semiconductor element 10 is not necessary.

Also, with the semiconductor device 100a as well, the height of the joining material 12a and the height of the joining material 22a are the same. Also, height of the joining material 11a and the height of the joining material 21a are the same, and the height of the joining material 14a and the height of the joining material 24a are the same. That is, in the thickness direction of the semiconductor elements 10 and 20, the position of the joining material 11a and the position of the joining material 21a are the same position, the position of the joining material 12a and the position of the joining material 22a are the same position, and the position of the joining material 14a and the position of the joining material 24a are the same position. Therefore, the number of height positions to set the focal point at when inspecting the joint state at the joint locations is fewer, so the inspection time is able to be shortened.

Furthermore, in the semiconductor device 100a, the encapsulation resin portion 53 covers the lower portion of the first thin plate portion 33 and the upper portion of the second thin plate portion 43, so the first thin plate portion 33 and the second thin plate portion 43 are not exposed on the surface. As a result, the distance between the first thick plate portion 31 and the second thick plate portion 32, and the distance between the third thick plate portion 41 and the fourth thick plate portion 42, is taken up by the encapsulation resin portion 53 that is an insulating body, so the creepage distance between the first thick plate portion 31 and the second thick plate portion 32, and between the third thick plate portion 41 and the fourth thick plate portion 42, can be ensured, thus enabling insulation to be improved.

In this way, in the semiconductor device 100a according to this modified example, insulation between the first thick plate portion 31 and the second thick plate portion 32, and insulation between the third thick plate portion 41 and the fourth thick plate portion 42, can be ensured, so they can be arranged close together, thus enabling the overall semiconductor device 100a to be small.

With the semiconductor device according to the modified example as well, a power control unit can be formed, and effects similar to those of the power control unit described in the first example embodiment can be obtained.

In this modified example, any of a variety of two-terminal elements such as a diode may be used as the first semiconductor element and the second semiconductor element.

Also, in this modified example as well, the first semiconductor element and the second semiconductor element may be different kinds of semiconductor elements.

Moreover, the first semiconductor element 10 may be prepared in a vertically flipped state beforehand, and the prepared first semiconductor element 10 may be arranged as it is. That is, the first thick plate portion 31 may be electrically connected to the electrode 12 of the first semiconductor element 10, and the third thick plate portion 41 may be electrically connected via the spacer 14 to the collector electrode 11 of the first semiconductor element 10. In this case as well, a process for vertically flipping the semiconductor element when arranging the semiconductor element is not necessary, so the inspection time can be shortened.

Second Example Embodiment

Next, a semiconductor device and a manufacturing method thereof according to a second example embodiment of the invention will be described.

The semiconductor device according to this example embodiment differs from the semiconductor device according to the first example embodiment in that two semiconductor elements are connected in parallel.

First, the semiconductor device according to this example embodiment will be described.

Figure 10:
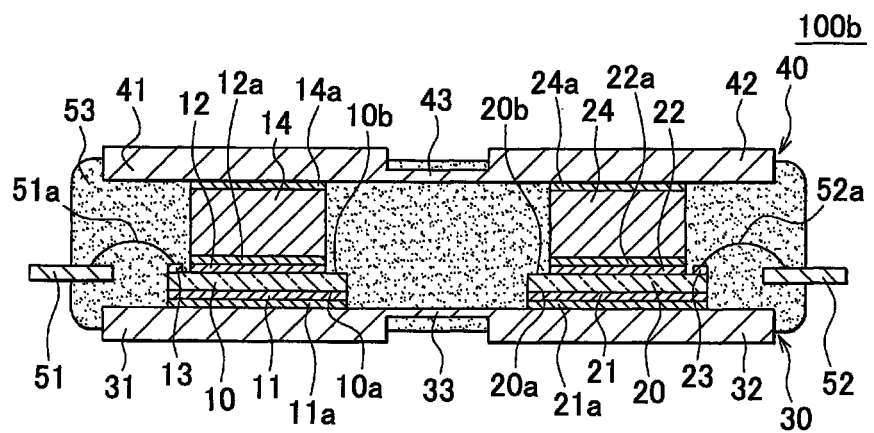
FIG. 10 is a sectional view showing a frame format of the structure of a semiconductor device according to a second example embodiment of the invention.

FIG. 10 is a sectional view showing a frame format of the structure of the semiconductor device according to this example embodiment.

A semiconductor device 100b includes a first semiconductor element 10, a second semiconductor element 20, a first thick plate portion 31, a second thick plate portion 32, a first thin plate portion 33, a third thick plate portion 41, a fourth thick plate portion 42, a second thin plate portion 43, a first control electrode terminal 51, a second control electrode terminal 52, and an encapsulation resin portion 53. The semiconductor device 100b has the same structure as the semiconductor device 100 according to the first example embodiment, except for that the first thick plate portion 31 and the second thick plate portion 32 are electrically connected via the first thin plate portion 33, and the third thick plate portion 41 and the fourth thick plate portion 42 are electrically connected via the second thin plate portion 43. Descriptions of like structures will be omitted.

The first thick plate portion 31, the second thick plate portion 32, and the first thin plate portion 33 are integrally formed, and together form the first lead frame 30. The third thick plate portion 41, the fourth thick plate portion 42, and the second thin plate portion 43 are integrally formed, and together form the second lead frame 40. The first lead frame 30 and the second lead frame 40 have shapes similar to those of the first lead frame 30 and the second lead frame 40 in the first example embodiment described above with reference to FIG. 4.

FIG. 11 is a circuit diagram of the structure of the semiconductor device according to this example embodiment. In FIG. 11, region I that is enclosed by the dotted line includes the semiconductor device shown in FIG. 10, and regions II and III enclosed by the alternate long and short dash lines may be regarded as IGBTs 10 and 20, respectively.

The electrical circuit shown in FIG. 11 is such that two of the inverter circuits shown in FIG. 2 are provided in parallel between a high-order side power supply and a low-order side power supply. In this electrical circuit, the electrical circuit shown in region I enclosed by the dotted line includes diodes 15 and 25, in addition to the IGBTs 10 and 20. The diodes 15 and 25 are connected in inverse-parallel to the IGBTs 10 and 20, respectively. That is, the electrical circuit shown in region I enclosed by the dotted line may be regarded as a portion on the high order side of a semiconductor module that includes the semiconductor device according to this example embodiment.

A high-order side power supply connecting terminal 16 for connecting to the high-order side power supply is electrically connected to the collector electrode 11 of the first semiconductor element 10 and the collector electrode 21 of the second semiconductor element 20. The high-order side power supply connecting terminal 16 is electrically connected to the first lead frame 30 of the semiconductor device 100b.

An output terminal 54 is electrically connected to an emitter electrode 12 of the first semiconductor element 10 and an emitter electrode 22 of the second semiconductor element 20. The output terminal 54 is electrically connected to the second lead frame 40 of the semiconductor device 100b.

The first control electrode terminal 51 is electrically connected to a gate electrode 13 of the first semiconductor element 10, and the second control electrode terminal 52 is electrically connected to a gate electrode 23 of the second semiconductor element 20, similar to the semiconductor device 100 according to the first example embodiment.

In this example embodiment, the first thick plate portion 31 and the second thick plate portion 32 are connected via the first thin plate portion 33. Also, the third thick plate portion 41 and the fourth thick plate portion 42 are connected via the second thin plate portion 43. The first thin plate portion 33 is thinner than both the first thick plate portion 31 and the second thick plate portion 32, so stress generated when the heights of the first thick plate portion 31 and the second thick plate portion 32 are different, for example, can be absorbed. Also, the second thin plate portion 43 is thinner than both the third thick plate portion 41 and the fourth thick plate portion 42, so stress generated when the heights of the third thick plate portion 41 and the fourth thick plate portion 42 are different, for example, can be absorbed.

Next, a manufacturing method of the semiconductor device according to this example embodiment will be described.

The manufacturing method of the semiconductor device according to this example embodiment is the same as the manufacturing method of the semiconductor device according to the first example embodiment described with reference to FIGS. 5A to 5C and 6A to 6C, with the exception of FIGS. 6A to 6C. Therefore, descriptions of like processes will be omitted.

Figure 12A:
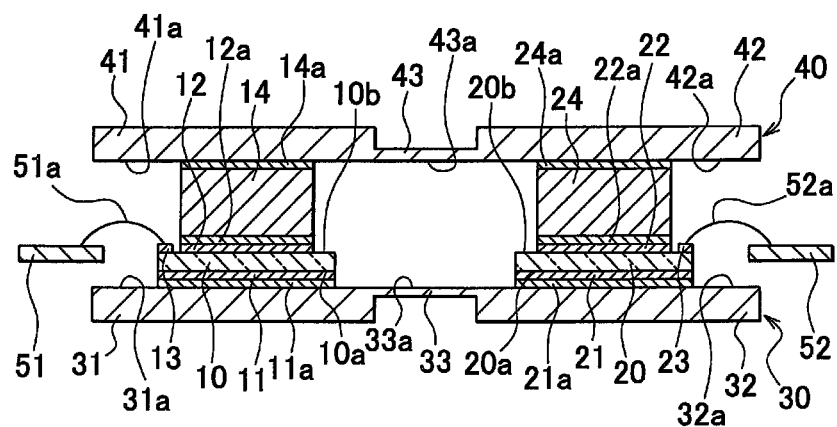
FIG. 12 is a sectional view showing a frame format of a manufacturing method of the semiconductor device according to the second example embodiment of the invention.
Figure 12B:
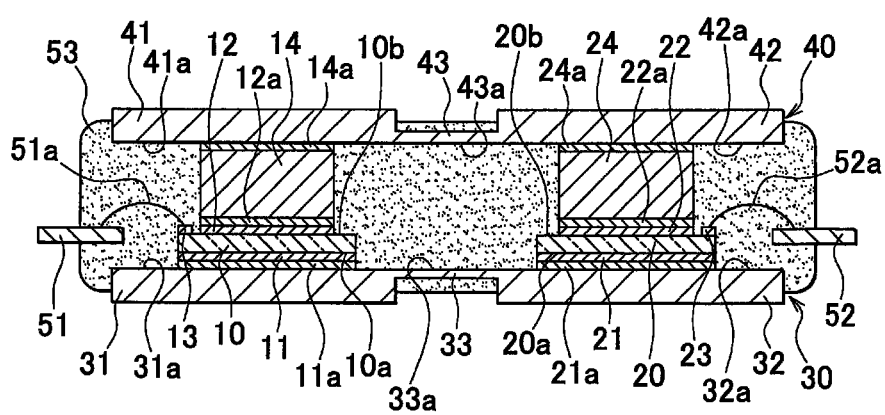

In this example embodiment, after the process shown in FIG. 5C, the processes shown in FIGS. 12A and 12B are performed instead of the processes shown in FIGS. 6A to 6C.

FIG. 12 is a sectional view showing a frame format of the manufacturing method of the semiconductor device according to this example embodiment. In FIG. 12, portions that are the same as those in FIG. 10 will be denoted by like reference characters, and descriptions of those portions may be omitted.

In the process shown in FIG. 12A, the first lead frame 30 and the second lead frame 40 are not broken apart. The first control electrode terminal 51 is arranged, and then the gate electrode 13 of the IGBT 10 is electrically connected to the first control electrode terminal 51 via the bonding wire 51a formed by Al wire or Au wire or the like, for example. Also, the second control electrode terminal 52 is arranged, and then the gate electrode 23 of the IGBT 20 is electrically connected to the second control electrode terminal 52 via the bonding wire 52a formed by Al wire or Au wire or the like, for example.

Moreover, when joining is not performed in a process before the process shown in FIG. 12A, the collector electrode 11 of the IGBT 10 is electrically connected to the first thick plate portion 31 by solder joining or ultrasonic joining or the like, for example, and the emitter electrode 12 of the IGBT 10 is electrically connected to the third thick plate portion 41 via the spacer 14 by solder joining or ultrasonic joining or the like, for example. Also, the electrode 21 of the IGBT 20 is electrically connected to the second thick plate portion 32, and the emitter electrode 22 of the IGBT 20 is electrically connected to the fourth thick plate portion 42 via the spacer 24.

Next, in the process shown in FIG. 12B, the structure shown in FIG. 12A is sealed using epoxy resin, for example, just as in the process shown in FIG. 6C. Performing this process completes the semiconductor device 100b.

With the semiconductor device 100b according to this example embodiment as well, the IGBTs 10 and 20 face the same direction, instead of being vertically flipped. Therefore, in the manufacturing process of the semiconductor device 100b, a process of vertically flipping the IGBT 10 when arranging the IGBT 10 is not necessary.

Also, with the semiconductor device 100b as well, the height of the joining material 12a and the height of the joining material 22a are the same. Also, height of the joining material 11a and the height of the joining material 21a are the same, and the height of the joining material 14a and the height of the joining material 24a are the same. That is, in the thickness direction of the IGBTs 10 and 20, the position of the joining material 11a and the position of the joining material 21a are the same position, the position of the joining material 12a and the position of the joining material 22a are the same position, and the position of the joining material 14a and the position of the joining material 24a are, the same position. Therefore, in the manufacturing process of the semiconductor device 100b, the number of height positions to set the focal point at when inspecting the joint state at the joint locations is fewer, so the inspection time is able to be shortened.

With the semiconductor device according to this example embodiment as well, a power control unit can be formed, and effects similar to those of the power control unit described in the first example embodiment can be obtained.

In this example embodiment as well, an example in which the same kind of IGBT is used for both the first semiconductor element and the second semiconductor element is described. However, instead of an IGBT, any of a variety of three-terminal elements such as an FET or a bipolar transistor may be used as the first semiconductor element and the second semiconductor element.

Also, in this example embodiment as well, any of a variety of two-terminal elements such as a diode may be used as the first semiconductor element and the second semiconductor element.

Also, with this example embodiment as well, the first semiconductor element and the second semiconductor element may be different kinds of semiconductor elements.

Third Example Embodiment

Figure 13:
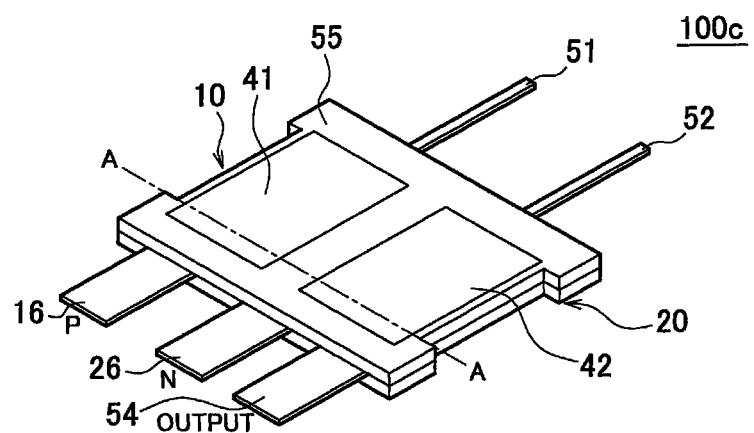
FIG. 13 is an external perspective view of an example of a semiconductor device according to a third example embodiment of the invention.

FIG. 13 is an external perspective view of an example of a semiconductor device 100c according to a third example embodiment of the invention. In this third example embodiment, constituent elements that are the same as constituent elements in the example embodiments described thus far will be denoted by like reference characters, and descriptions of those constituent elements will be omitted.

In FIG. 13, the semiconductor device 100c according to the third example embodiment includes a third thick plate portion 41, a fourth thick plate portion 42, encapsulation resin 55, a high-order side power supply connecting terminal 16, a low-order side power supply connecting terminal 26, an output terminal 54, a first control electrode terminal 51, and a second control electrode terminal 52. In FIG. 13, the center portion formed by the third thick plate portion 41, the fourth thick plate portion 42, and the encapsulation resin 55 is a semiconductor element carrying portion that includes therein a first semiconductor element 10 and a second semiconductor element 20. The high-order side power supply connecting terminal 16, the low-order side power supply connecting terminal 26, and the output terminal 54 are external terminal portions that supply power from the outside and output signals to the outside. The first control electrode terminal 51 and the second control electrode terminal 52 are signal inputting terminal portions that receive signals.

In FIG. 13, the electrode structural arrangement differs from that shown in FIG. 1 of the first example embodiment in that the low-order side power supply connecting terminal 26 is arranged in the center, and the output terminal 54 is arranged on the right side. However, the substantive circuit configuration is the same as that of the first example embodiment, so like reference characters will be used and a description of the circuit configuration will be omitted.

Figure 14:
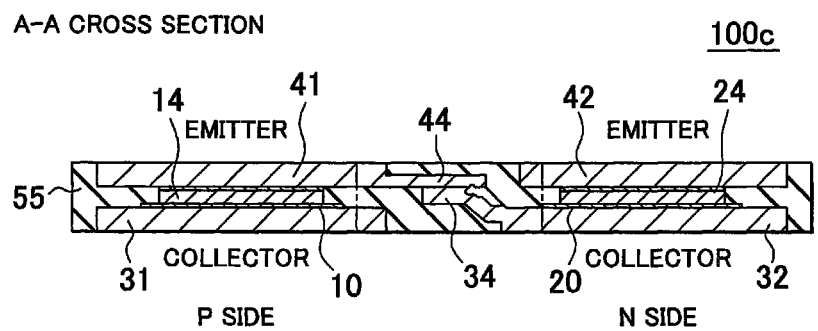
FIG. 14 is a sectional block diagram of the semiconductor device according to the third example embodiment, that shows a cross section taken along line A-A in FIG. 13.

FIG. 14 is a sectional block diagram of the semiconductor device 100c according to the third example embodiment, that shows a cross section taken along line A-A in FIG. 13. In FIG. 14, the semiconductor device according to the third example embodiment includes a first semiconductor element 10, a second semiconductor element 20, a first thick plate portion 31, a second thick plate portion 32, a third thick plate portion 41, a fourth thick plate portion 42, spacers 14 and 24, a first thin plate portion 34, a second thin plate portion 44, and encapsulation resin 55.

In FIG. 14, the various electrodes arranged above and below the first semiconductor element 10, the second semiconductor element 20, and the spacers 14 and 24 are omitted, unlike FIGS. 1, 5, 6, 7, 9, 10, and 12. However, the structure in FIG. 14 is similar to that in FIGS. 1, 5, 6, 7, 9, 10, and 12, so various electrodes may be provided above and below the first semiconductor element 10, the second semiconductor element 20, and the spacers 14 and 24.

Although not shown in FIG. 14, an electrode is provided both on the upper surface side and the lower surface side of the first semiconductor element 10. An emitter electrode is provided on the upper surface side, and a collector electrode is provided on the lower surface side, which is the same as in the example embodiments thus far. Therefore, the first thick plate portion 31 is electrically connected to the collector electrode of the first semiconductor element 10, and the spacer 14 and the third thick plate portion 41 are electrically connected to the emitter electrode of the first semiconductor element 10. Similarly, an emitter electrode is provided on the upper surface side of the second semiconductor element 20, and a collector electrode is provided on the lower surface side of the second semiconductor element 20. The second thick plate portion 32 is electrically connected to the collector electrode of the second semiconductor element 20, and the spacer 24 and the fourth thick plate portion 42 are electrically connected to the emitter electrode of the second semiconductor element 20.

Also, the first thin plate portion 34 is provided extending from the second thick plate portion 32 below the second semiconductor element 20 toward the first semiconductor element 10 side, and the second thin plate portion 44 is provided extending from the third thick plate portion 41 above the first semiconductor element 10 toward the second semiconductor element 20 side. That is, the first thin plate portion 34 is electrically connected to the collector electrode of the second semiconductor element 20, and the second thin plate portion 44 is electrically connected to the emitter electrode of the first semiconductor element 10.

In the semiconductor devices 100 and 100a according to the first example embodiment, the first thin plate portion 33 is bent upward and the second thin plate portion 43 is bent downward, and the first thin plate portion 33 and the second thin plate portion 43 are joined at a position substantially in the middle of the interval between the first thick plate portion 31 and the third thick plate portion 41. However, the semiconductor device 100c according to the third example embodiment differs from the semiconductor devices 100 and 100a according to the first example embodiment in that the second thin plate portion 44 extends horizontally, having the same surface as the lower surface of the third thick plate portion 41, and only the first thin plate portion 34 is curved upward and is joined to the lower surface of the second thin plate portion 44.

The first semiconductor element 10, the second semiconductor element 20, the first thick plate portion 31, the second thick plate portion 32, the third thick plate portion 41, the fourth thick plate portion 42, the first thin plate portion 34, and the second thin plate portion 44 are all mold formed by the encapsulation resin 55 such that only the lower surfaces of the first thick plate portion 31 and the second thick plate portion 32 and the upper surfaces of the third thick plate portion 41 and the fourth thick plate portion 42 are exposed. The encapsulation resin 55 wraps around above the upper surface of the second thin plate portion 44 that is lower than the upper surface of the third thick plate portion 41, thereby covering the second thin plate portion 44.

The circuit diagram of the semiconductor device 100c according to the third example embodiment is the same as the circuit diagram shown in FIG. 2 of the semiconductor device 100 according to the first example embodiment. Therefore, a detailed description of the circuit configuration of the semiconductor device 100c according to the third example embodiment will be omitted.

Next, the specific structure and function of the semiconductor device 100c according to the third example embodiment will be described in more detail focusing on the individual structures and functions.

Figure 15:
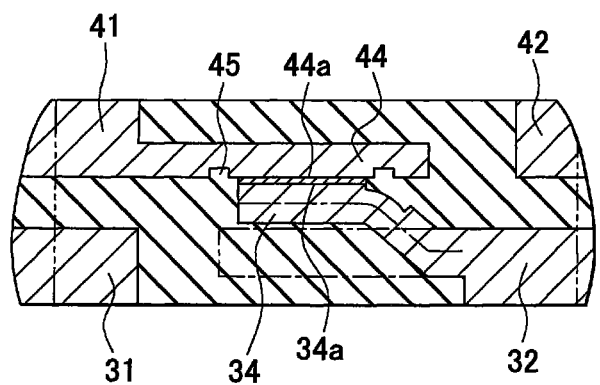
FIG. 15 is an enlarged view of a joint portion between first thin plate portions of the semiconductor device according to the third example embodiment of the invention.

FIG. 15 is an enlarged view of a joint portion between thin plate portions of the semiconductor device 100c according to the third example embodiment of the invention. FIG. 15 shows the joint portion of the first thin plate portion 34 and the second thin plate portion 44, and a state in which a joining surface 34a on an upper surface of the first thin plate portion 34 is joined to a joining surface 44a on a lower surface of the second thin plate portion 44. The second thin plate portion 44 extends horizontally from the third thick plate portion 41, with the lower surface being the same surface. In contrast, the first thin plate portion 34 is bent upward to form the joining surface 34a that joins with the second thin plate portion 44. Here, the joint between the joining surface 44a of the second thin plate portion 44 and the joining surface 34a of the first thin plate portion 34 is formed by joining material such as solder. At that time, a groove 45 is provided around the joining surface 44a to absorb any excess joining material. The groove 45 is formed in the lower surface of the first thin plate portion 34 so as to surround the joining surface 44a. Typically, adjusting the amount of joining material such as solder is extremely difficult, and more joining material than is necessary for the joint may be supplied when joining is performed. The groove 45 for absorbing joining material is provided around the joining surface 44a of the second thin plate portion 44 so that the excess joining material can be absorbed in just such a case. Also, machining for forming the groove 45 is generally easy so a highly precise groove 45 can be formed.

In this way, with the semiconductor device 100c according to the third example embodiment, excess joining material can be absorbed, so the necessary electrical connection can be ensured, by forming the groove 45 around the joining surface 44a of the second thin plate portion 44.

Figure 16:
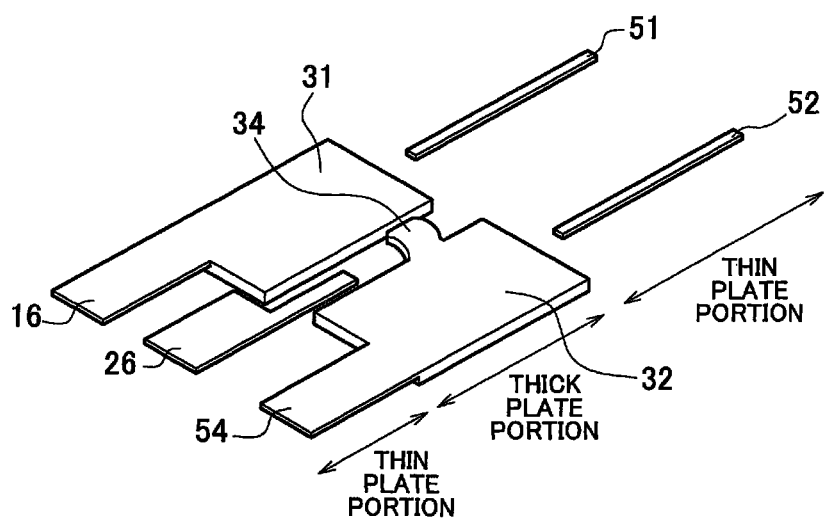
FIG. 16 is a perspective view of the structure of thick plate portions and thick plate portions on a lower side of the semiconductor device according to the third example embodiment of the invention.

FIG. 16 is a perspective view of the structure of thick plate portions and thick plate portions on a lower side of the semiconductor device according to the third example embodiment of the invention. FIG. 16 shows the first thick plate portion 31, the second thick plate portion 32, and the first thin plate portion 34 that is integrated with the second thick plate portion 32. Also, the high-order side power supply connecting terminal 16 extends on the near side from the first thick plate portion 31, and the first control electrode terminal 51 is provided on the far side of the first thick plate portion 31. Similarly, the output terminal 54 extends on the near side from the second thick plate portion 32, and the second control electrode terminal 52 is provided on the far side of the second thick plate portion 32. Furthermore, the low-order side power supply connecting terminal 26 is provided between the high-order side power supply connecting terminal 16 and the output terminal 54. The low-order side power supply connecting terminal 26 is a connecting terminal that is electrically connected to the fourth thick plate portion 42 arranged on the upper side, and is shown corresponding to FIG. 13.

With the electrode on the lower side having this structure, the second thick plate portion 32 and the first thin plate portion 34 have different shapes and thicknesses, and so are formed as different shaped members from metal plates having overall different shapes. The second thick plate portion 32 is an electrode that is connected to the collector electrode of the second semiconductor element 20, and also functions as a radiator plate that radiates heat generated by the second semiconductor element 20. Therefore, the second thick plate portion 32 has more surface area than the entire lower surface of the second semiconductor element 20, is provided directly below the second semiconductor element 20, and is formed thick. On the other hand, the first thin plate portion 34 functions as an internal connecting lead for connecting the second thick plate portion 32 to the third thick plate portion 41. In the semiconductor device 100c according to this example embodiment, the first thin plate portion 34 is integrally formed with the second thick plate portion 32, so the amount of copper used can be reduced, thus enabling material costs to be reduced.

Further, the first thin plate portion 34 directly connects, by an electrode piece, electrodes above and below the first semiconductor element 10 and the second semiconductor element 20 that are arranged parallel and adjacent to one another, and is thus electrically short wiring. That is, when a lead wire or the like is used, long wiring is drawn around, so the electrical resistance and inductance of the lead wire increases and circuit operation of the semiconductor device 100c ends up becoming slower. However, in the semiconductor device 100c according to this example embodiment, the electrodes are connected using the first thin plate portion 34 that is shaped like a short electrode piece with a short wiring length and larger sectional area than a lead wire. Therefore, the electrical resistance and the inductance are reduced, so the circuit operation can be faster.

Also, in FIG. 16, the first thin plate portion 34 electrically connects the first semiconductor element 10 and the second semiconductor element 20 therein, so the first thin plate portion 34 may also be referred to as an internal lead 34. Also, the high-order side power supply connecting terminal 16, the low-order side power supply connecting terminal 26, and the output terminal 54 are portions that are exposed to the outside when resin sealed by mold forming, and are electrically connected to the outside, so they may also be referred to as external leads 16, 26, and 54. Therefore, the relationships among the internal lead 34, the external leads 16, 26, and 54, and the first and second thick plate portions 31 and 32 are as shown in Expression (1).

$$\text{External leads 16, 26, and 54} \leq \text{internal lead 34} < \text{thick plate portions 31 and 32} \quad (1)$$

That is, the internal lead 34 is as thick as or thicker than the external leads 16, 26, and 54, and thinner than the first and second thick plate portions 31 and 32. The reason for having the internal lead 34 be as thick as or thicker than the external leads 16, 26, and 54 is to reduce the inductance by the internal lead 34 and reduce the inductance inside the semiconductor package. That is, a thicker internal lead 34 that connects the first semiconductor element 10 and the second semiconductor element 20 results in lower electrical resistance and inductance, which is electrically advantageous and enables the circuit operation to be more stable and faster. However, if the internal lead 34 is too thick, it is more difficult to bend (i.e., machine) and the surface is more difficult to cover with the encapsulation resin 55. Therefore, the internal lead 34 is preferably as thick as possible with due consideration given to the ease of machining and ensuring insulation by the encapsulation resin 55, so a relationship such as that shown in Expression (1) is made sure to be satisfied.

The thickness of the external leads 16, 26, and 54 may be within a range of 0.3 to 0.7 mm, inclusive, for example, 0.5 mm. Also, the thickness of the internal lead 34 may be within a range of 0.7 to 1.2 mm, inclusive, for example, 1.0 mm. Also, the thickness of the first and second thick plate portions 31 and 32 may be within a range of 1.7 to 3.5 mm, inclusive, for example, 2.0 to 3.0 mm, inclusive.

The first and second thick plate portions 31 and 32 and the third and fourth thick plate portions 41 and 42 are often all the same thickness, so the thick plate portions in Expression (1) may be rewritten as thick plate portions 31, 32, 41, and 42.

Also, in FIG. 16, the first and second control electrode terminals 51 and 52 may be structured as thin plate portions comparable to the external leads 16, 26, and 54. For example, when the thickness of the external leads 16, 26, and 54 is 0.5 mm, the first and second control electrode terminals 51 and 52 may also be formed approximately 0.5 mm thick.

FIG. 14 shows the sectional structure of the semiconductor device 100c according to this example embodiment also taking into account the relationship of the thickness of the second thin plate portion 44 that is on the upper side. In FIG. 14, the sectional structure of the joining portion of the second thin plate portion 44 and the first thin plate portion 34 is shown, and the first thin plate portion 34 is somewhat thicker than the second thin plate portion 44. In this way, the thickness of the first thin plate portion 34 may be different from the thickness of the second thin plate portion 44. At the joining portion, the overall thickness after joining need only be thick. Electrically it makes no difference whether the first thin plate portion 34 is thicker than the second thin plate portion 44, or conversely, whether the second thin plate portion 44 is thicker than the first thin plate portion 34, or whether they are the same thickness. Therefore, a structure that is easy to machine may be employed, but it is preferable that the encapsulation resin 55 covers the second thin plate portion 44 above the second thin plate portion 44, to ensure insulation. Also, in terms of machining, it is easier to make a portion of the third and fourth thick plate portions 41 and 42 on the upper side thinner.

Therefore, with the second thin plate portion 44 on the upper side, the relationship in Expression (2) is preferably satisfied.

$$\text{External leads 16, 26, and 54} \leq \text{internal lead 44} < \text{thick plate portions 41 and 42} \quad (2)$$

That is, the second thin plate portion 44 that is an internal lead is as thick as or thicker than the external leads 16, 26, and 54, and thinner than the thick plate portions 41 and 42. For example, when the external leads 16, 26, and 54 are 0.5 mm, the internal lead may also be 0.5 mm just like the external leads 16, 26, and 54, and the thick plate portions 41 and 42 may be 2.0 to 3.0 mm thick.

Also, in Expression (2), the thick plate portions may be rewritten as thick plate portions 31, 32, 41, and 42, just like in Expression (1).

In this way, making the internal leads 34 and 44 as thick as or thicker than the external leads 16, 26, and 54, and thinner than the thick plate portions 31, 32, 41, and 42 enables the inductance in the package to be reduced.

Moreover, from FIG. 16 it is evident that the first thick plate portion 31 and the second thick plate portion 32 are arranged in parallel, adjacent to each other, at a relatively close distance. Similarly, from FIG. 14 it is evident that the third thick plate portion 41 and the fourth thick plate portion 42 are also arranged adjacent at a relatively close distance. The second thin plate portion 44 is arranged in the space between the third thick plate portion 41 and the fourth thick plate portion 42 that are relatively close together, so the second thin plate portion 44 is provided on a side surface of the third thick plate portion 41 on the side that faces the fourth thick plate portion 42, and extends horizontally toward the opposing surface of the fourth thick plate portion 42.

Meanwhile, the structure after the semiconductor device according to the third example embodiment is mold formed is shown in FIG. 13. When the semiconductor device 100c is mold formed, the encapsulation resin 55 covers the upper portion of the second thin plate portion 44, such that the second thin plate portion 44 is not exposed on the upper surface. As a result, the distance between the third thick plate portion 41 and the fourth thick plate portion 42 is taken up by the encapsulation resin 55 that is an insulating body, so the creepage distance between the third thick plate portion 41 and the fourth thick plate portion 42 can be ensured, thus enabling insulation to be improved.

In this way, in the semiconductor device 100c according to the third example embodiment, insulation between the third thick plate portion 41 and the fourth thick plate portion 42 can be ensured, so they can be arranged close together, thus enabling the overall semiconductor device 100c to be small.

Figure 17:
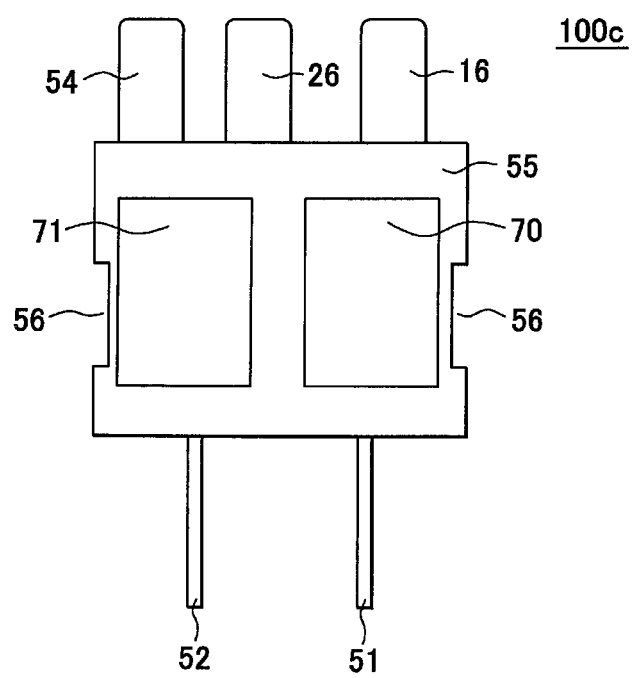
FIG. 17 is a view of an example of a finished product after resin sealing of the semiconductor device according to the third example embodiment of the invention.

FIG. 17 is a view of an example of a finished product after resin sealing of the semiconductor device according to the third example embodiment of the invention. In FIG. 17, the main body of the semiconductor device is mold formed with the encapsulation resin 55, but the first and second semiconductor elements 10 and 20 and the diodes 15 and 25 are present, and heat sinks 70 and 71 are mounted above locations covered by the third and fourth thick plate portions 41 and 42. Also, the high-order side power supply connecting terminal 16, the low-order side power supply connecting terminal 26, and the output terminal 54 are provided exposed from the encapsulation resin 55 on one side in the longitudinal direction, and the first and second control electrode terminals 51 and 52 are provided exposed from the encapsulation resin 55 on the other side.

Here, the encapsulation resin 55 has indented portions 56 that are indented horizontally inward, on the side surfaces on the outer sides of the heat sinks 70 and 71. The indented portions 56 are formed within an area that includes a location between where the first semiconductor element 10 and the diode 15 are arranged, and a location between where the second semiconductor element 20 and the diode 25 are arranged. The indented portions 56 are designed to prevent air from being trapped, and thus prevent a void from occurring, when mold forming using the encapsulation resin 55. Hereinafter, this will be described in detail.

Figure 18:
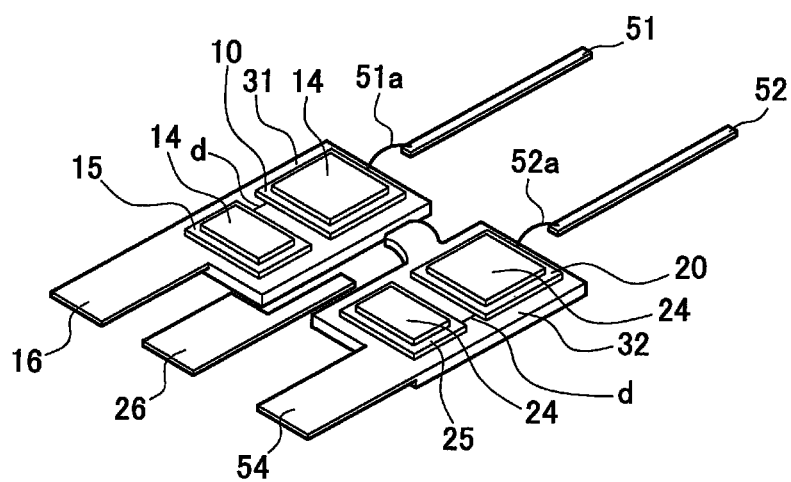
FIG. 18 is a perspective view of the internal structure of the semiconductor device according to the third example embodiment of the invention.

FIG. 18 is a perspective view of the internal structure of the semiconductor device 100c according to the third example embodiment of the invention. In FIG. 18, the first semiconductor element 10 and the diode 15 that is the third semiconductor element are arranged with an interval d therebetween in the longitudinal direction on the first thick plate portion 31. Similarly, the second semiconductor element 20 and the diode 25 that is the fourth semiconductor element are arranged with an interval d therebetween in the longitudinal direction on the second thick plate portion 32. The indented portion 56 shown in FIG. 17 is formed on a side surface on the outside of the encapsulation resin 55, so as to include the area where the interval d is.

The first control electrode terminal 51 is electrically connected to the gate electrode 13 of the IGBT 10 via the bonding wire 51a formed by Al wire or Au wire or the like, for example. Similarly, the second control electrode terminal 52 is electrically connected to the gate electrode 23 of the IGBT 20 via the bonding wire 52a formed by Al wire or Au wire or the like; for example.

FIG. 19 is a view of resin flow analysis results when pouring molten encapsulation resin 55 into a mold and performing mold forming.

Figure 19A:
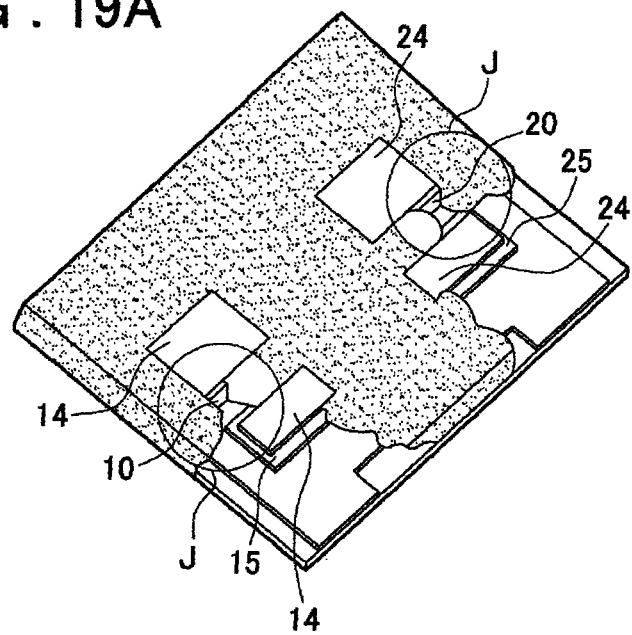
FIGS. 19A and 19B are views of resin flow analysis results when pouring molten encapsulation resin into a mold and performing mold forming, with FIG. 19A being a view of the resin flow analysis results when mold forming a semiconductor device according to a comparative example of the third example embodiment in which there is no indented portion, and FIG. 19B being a view of the resin flow analysis results when mold forming a semiconductor device according to the third example embodiment in which there is an indented portion.

FIG. 19A is a view of the resin flow analysis results when mold forming a semiconductor device according to a comparative example of the third example embodiment in which there is no indented portion 56. In FIG. 19A, there is a flow in which the encapsulation resin 55 flows in from a center portion between the first semiconductor element 10 and the second semiconductor element 20, and a flow in which the encapsulation resin 55 flows in from outside of the first semiconductor element 10 and the second semiconductor element 20, and these flows are shown merging at a merging portion J. Here, when comparing the flow on the outside of the first and second semiconductor elements 10 and 20 (i.e., the outside flow) and the flow from the center toward the merging portion J, it is evident that the outside flow reaches the merging portion J quicker. In this case, the outside flow reaches the merging portion J first and forms a wall on the outside, and then the encapsulation resin 55 flows into the merging portion J from the center. As a result, air that is pushed to the outside when the encapsulation resin 55 flows into the merging portion J from the center strikes the wall formed by the outside flow. Hence, the air has no way to escape and may create a void as it is. That is, the air is trapped at the merging portion J, so a void may remain inside the encapsulation resin 55.

Figure 19B:
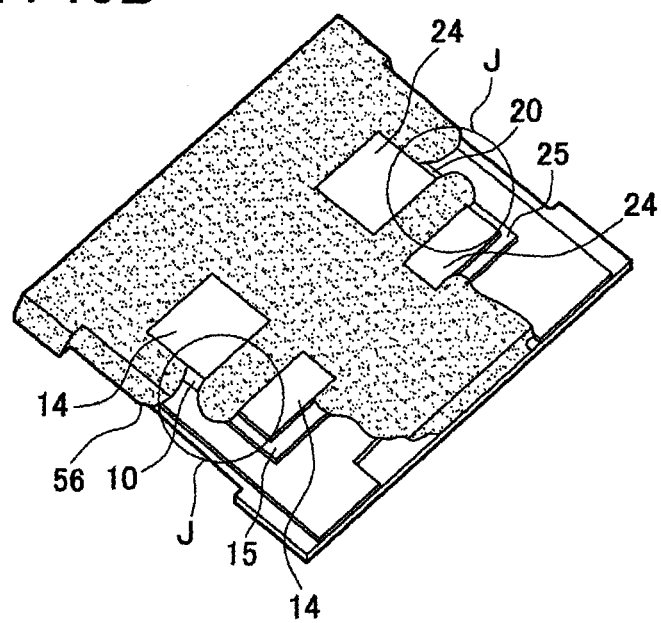

FIG. 19B is a view of the resin flow analysis results when mold forming the semiconductor device according to the third example embodiment having the indented portion 56. In the semiconductor device 100c according to the third example embodiment, a mold is shaped protruding inward on the inside surface, such that the flow path between the inside of the side wall of the mold on the outside and the outside of the first semiconductor element 10 and the third semiconductor element 15 at an area that includes the interval d between the first semiconductor element 10 and the third semiconductor element 15, and the flow path between the inside of the side wall of the mold on the outside and the outside of the second semiconductor element 20 and the fourth semiconductor element 25 at an area that includes the interval d between the second semiconductor element 20 and the fourth semiconductor element 25, are narrow, as described with reference to FIGS. 17 and 18. Accordingly, the flowrate of the encapsulation resin 55 that flows along the outside of the first, second, third, and fourth semiconductor elements 10, 15, 20, and 25 becomes slower, so the outside flow reaches the merging portion J at the substantially same time that the flow from the center does. At this time, there is no encapsulation resin 55 that creates a wall present ahead of the air that, is pushed toward the outside by the flow from the center, so that air can be pushed outside, thereby preventing air from being trapped. As a result, it is possible to prevent a void from remaining inside the encapsulation resin 55, so a very durable, highly reliable semiconductor device 100c can be provided.

In this way, with the semiconductor device 100c according to the third example embodiment, forming the indented portion 56 that is indented inward in an area that includes the interval between semiconductor elements, of the side surface on the outside of the encapsulation resin 55 makes it possible to prevent a void from occurring inside the encapsulation resin 55, and thus enables a highly reliably semiconductor device 100c to be formed.

In the first and third example embodiments, an example is given in which the joining surface of the first thin plate portions 33 and 34 and the second thin plate portions 43 and 44 is in a position midway between the first thick plate portion 31 and the third thick plate portion 41, or in a position on the lower surface of the third thick plate portion 41, in the thickness direction, but the position may be changed as appropriate as long as it is between the upper surface of the first thick plate portion 31 and the lower surface of the third thick plate portion 41.

While the invention has been described with reference to example embodiments thereof, it should be understood that the invention is not limited to these specific example embodiments. That is, the invention may be carried out in modes that have been modified or improved in any of a variety of ways within the scope of the claims for patent.

Accordingly, the first through the third example embodiments may be appropriately combined as long as they are compatible. For example, the relationship of the thickness of the internal leads and the external leads described in the third example embodiment, and a structure in which an indented portion is formed on a side surface in the longitudinal direction during mold forming may also be applied to the first and second example embodiments. Also, if in the first and second example embodiments one horizontal region where the joining surface is formed is larger than another, a structure in which a groove is provided around the joining surface described in the third example embodiment may also be applied by forming a groove around the joining surface having the large region.

The invention claimed is:

1. A semiconductor device comprising:
a first semiconductor element;
a first thick plate portion that is electrically connected to an electrode on a lower surface side of the first semiconductor element, and that is formed by a conductor;
a second semiconductor element, wherein the second semiconductor element is disposed to face the same direction as the first semiconductor element and the lower surface side of the second semiconductor element is substantially flush with the lower surface side of the first semiconductor element;
a second thick plate portion that is electrically connected to an electrode on a lower surface side of the second semiconductor element, and that is formed by a conductor;
a third thick plate portion that is electrically connected to an electrode on an upper surface side of the first semiconductor element, and that is formed by a conductor;
a fourth thick plate portion that is electrically connected to an electrode on an upper surface side of the second semiconductor element, and that is formed by a conductor;
a first thin plate portion that is provided on the second thick plate portion, is formed by a conductor, and is thinner than both the first thick plate portion and the second thick plate portion; and
a second thin plate portion that is provided on the third thick plate portion, is formed by a conductor, and is thinner than both the third thick plate portion and the fourth thick plate portion,
wherein the first thin plate portion and the second thin plate portion are fixed together and electrically connected, and wherein the first thin plate portion is provided on the first thick plate portion side of the second thick plate portion; the second thin plate portion is provided on the fourth thick plate portion side of the third thick plate portion; and the first thin plate portion and the second thin plate portion are electrically connected in a position between a position of the first thick plate portion and a position of the third thick plate portion, in a thickness direction of the first semiconductor element.

2. The semiconductor device according to claim 1, wherein the first thin plate portion and the second thin plate portion are electrically connected in a position midway between the position of the first thick plate portion and the position of the third thick plate portion, in the thickness direction of the first semiconductor element.

3. A semiconductor device comprising:
a first semiconductor element;
a first thick plate portion that is electrically connected to an electrode on a lower surface side of the first semiconductor element, and that is formed by a conductor;
a second semiconductor element, wherein the second semiconductor element is disposed to face the same direction as the first semiconductor element and the lower surface side of the second semiconductor element is substantially flush with the lower surface side of the first semiconductor element;
a second thick plate portion that is electrically connected to an electrode on a lower surface side of the second semiconductor element, and that is formed by a conductor;
a third thick plate portion that is electrically connected to an electrode on an upper surface side of the first semiconductor element, and that is formed by a conductor;
a fourth thick plate portion that is electrically connected to an electrode on an upper surface side of the second semiconductor element, and that is formed by a conductor;
a first thin plate portion that is provided on the second thick plate portion, is formed by a conductor, and is thinner than both the first thick plate portion and the second thick plate portion; and
a second thin plate portion that is provided on the third thick plate portion, is formed by a conductor, and is thinner than both the third thick plate portion and the fourth thick plate portion,
wherein the first thin plate portion and the second thin plate portion are fixed together and electrically connected, and wherein the first thin plate portion is provided on the first thick plate portion side of the second thick plate portion; the second thin plate portion is provided on the fourth thick plate portion side of the third thick plate portion; the second thin plate portion extends horizontally and has a same flat surface as a lower surface of the third thick plate portion; and the first thin plate portion includes a shaped portion that is bent upward to form a joining surface that contacts a lower surface of the second thin plate portion.

4. The semiconductor device according to claim 1, further comprising resin that covers the first semiconductor element, the second semiconductor element, the first thin plate portion, and the second thin plate portion.

5. The semiconductor device according to claim 4, further comprising an external lead that is electrically connected to one of the first, second, third, and fourth thick plate portions, and is exposed outside of the resin, wherein the first thin plate portion and the second thin plate portion each have a thickness of equal to or greater than that of the external lead.

6. The semiconductor device according to claim 4, further comprising a third semiconductor element arranged at a predetermined interval from the first semiconductor element, on the first thick plate portion, wherein a side surface of the resin has an indented portion that is indented inward on a side opposite the second thin plate portion, in an area that includes the predetermined interval.

7. The semiconductor device according to claim 4, further comprising a fourth semiconductor element arranged at the predetermined interval from the second semiconductor element, on the second thick plate portion, wherein a side surface of the resin has an indented portion that is indented inward on a side opposite the first thin plate portion, in an area that includes the predetermined interval.

8. The semiconductor device according to claim 1, wherein a groove is formed an area of at least one of a joining surface that is formed on the first thin plate portion and contacts a lower surface of the second thin plate portion, and a joining surface that is formed on the second thin plate portion and contacts an upper surface of the first thin plate portion.

9. A semiconductor device comprising:
a first semiconductor element;
a second semiconductor element that faces a same direction as the first semiconductor element, and in which a same-side surface that is a surface on a same side as one surface of the first semiconductor element is provided so as to be substantially flush with the one surface of the first semiconductor element;
a first thick plate portion that is electrically connected to the one surface of the first semiconductor element, and that is formed by a conductor;

a second thick plate portion that is electrically connected to the same-side surface of the second semiconductor element, and that is formed by a conductor;
a third thick plate portion that is electrically connected to a surface on a side opposite the one surface of the first semiconductor element, and that is formed by a conductor;
a fourth thick plate portion that is electrically connected to a surface on a side opposite the same-side surface of the second semiconductor element, and that is formed by a conductor;
a first thin plate portion that is formed by a conductor that is thinner than the first thick plate portion and the second thick plate portion, and that is electrically connected to the first thick plate portion and the second thick plate portion; and
a second thin plate portion that is formed by a conductor that is thinner than the third thick plate portion and the fourth thick plate portion, and that is electrically connected to the third thick plate portion and the fourth thick plate portion.

10. The semiconductor device according to claim 9, wherein the second semiconductor element is a same kind of semiconductor element as the first semiconductor element; a first electrode is formed on the one surface of the first semiconductor element and the same-side surface of the second semiconductor element; a second electrode is formed on the surface on the side opposite the one surface of the first semiconductor element and the surface on the side opposite the same-side surface of the second semiconductor element; the first thick plate portion is electrically connected to the first electrode of the first semiconductor element; the second thick plate portion is electrically connected to the first electrode of the second semiconductor element; the third thick plate portion is electrically connected to the second electrode of the first semiconductor element; and the fourth thick plate portion is electrically connected to the second electrode of the second semiconductor element.

11. The semiconductor device according to claim 10, wherein the first semiconductor element and the second semiconductor element are both IGBTs; and the first electrode is a collector electrode, and the second electrode is an emitter electrode.

12. A semiconductor device manufacturing method comprising:
a first step of arranging a first conductive plate that is formed by a conductor and includes a first thick plate portion, a second thick plate portion, and a first thin plate portion that is provided between the first thick plate portion and the second thick plate portion and is thinner than both the first thick plate portion and the second thick plate portion, such that the first thick plate portion contacts one surface of a first semiconductor element, and the second thick plate portion contacts a same-side surface, that is a surface on a same side as the one surface, of a second semiconductor element, wherein the second semiconductor element is disposed to face the same direction as the first semiconductor element and the lower surface side of the second semiconductor element is substantially flush with the lower surface side of the first semiconductor element;
a second step of arranging a second conductive plate that is formed by a conductor and includes a third thick plate portion, a fourth thick plate portion, and a second thin plate portion that is provided between the third thick plate portion and the fourth thick plate portion and is thinner than both the third thick plate portion and the fourth thick plate portion, such that the third thick plate portion contacts a surface on a side opposite the one surface of the first semiconductor element, and the fourth thick plate portion contacts a surface that is on a side opposite the same-side surface of a second semiconductor element; and
a third step of electrically connecting the one surface of the first semiconductor element with the first thick plate portion, electrically connecting the surface on the side opposite the one surface of the first semiconductor element with the third thick plate portion, electrically connecting the same-side surface of the second semiconductor element with the second thick plate portion, and electrically connecting the surface on the side opposite the same-side surface of the second semiconductor element with the fourth thick plate portion.

13. The semiconductor device manufacturing method according to claim 12, further comprising:
a fourth step of separating the first thin plate portion from the first thick plate portion, and separating the second thin plate portion from the fourth thick plate portion, and contacting the separated first thin plate portion with the separated second thin plate portion; and
a fifth step of electrically connecting the first thin plate portion and the second thin plate portion that are contacting each other.

14. The semiconductor device manufacturing method according to claim 12, wherein one surface of the first thick plate portion, one surface of the second thick plate portion, and one surface of the first thin plate portion are flush; the first step involves arranging the first conductive plate such that the one surface of the first thick plate portion contacts the first semiconductor element, and the one surface of the second thick plate portion contacts the second semiconductor element; one surface of the third thick plate portion, one surface of the fourth thick plate portion, and one surface of the second thin plate portion are flush; and the second step involves arranging the second conductive plate such that the one surface of the third thick plate portion contacts the first semiconductor element, and the one surface of the fourth thick plate portion contacts the second semiconductor element.

15. The semiconductor device manufacturing method according to claim 12, wherein the second semiconductor element is a same kind of semiconductor element as the first semiconductor element; a first electrode is formed on the one surface of the first semiconductor element and the same-side surface of the second semiconductor element; a second electrode is formed on the surface on the side opposite the one surface of the first semiconductor element and the surface on the side opposite the same-side surface of the second semiconductor element; and the third step involves electrically connecting the first electrode of the first semiconductor element to the first thick plate portion; electrically connecting the second electrode of the first semiconductor element to the third thick plate portion; electrically connecting the first electrode of the second semiconductor element to the second thick plate portion; and electrically connecting the second electrode of the second semiconductor element to the fourth thick plate portion.

16. The semiconductor device manufacturing method according to claim 15, wherein the first semiconductor element and the second semiconductor element are both IGBTs; the first electrode is a collector electrode; and the second electrode is an emitter electrode.

17. The semiconductor device according to claim 3, further comprising resin that covers the first semiconductor element, the second semiconductor element, the first thin plate portion, and the second thin plate portion.

18. The semiconductor device according to claim 17, further comprising an external lead that is electrically connected to one of the first, second, third, and fourth thick plate portions, and is exposed outside of the resin, wherein the first thin plate portion and the second thin plate portion each have a thickness of equal to or greater than that of the external lead.

19. The semiconductor device according to claim 17, further comprising a third semiconductor element arranged at a predetermined interval from the first semiconductor element, on the first thick plate portion, wherein a side surface of the resin has an indented portion that is indented inward on a side opposite the second thin plate portion, in an area that includes the predetermined interval.

20. The semiconductor device according to claim 17, further comprising a fourth semiconductor element arranged at the predetermined interval from the second semiconductor element, on the second thick plate portion, wherein a side surface of the resin has an indented portion that is indented inward on a side opposite the first thin plate portion, in an area that includes the predetermined interval.

21. The semiconductor device according to claim 3, wherein a groove is formed an area of at least one of a joining surface that is formed on the first thin plate portion and contacts a lower surface of the second thin plate portion, and a joining surface that is formed on the second thin plate portion and contacts an upper surface of the first thin plate portion.

* * * * *